US008436756B2

United States Patent
Hashimoto et al.

(10) Patent No.: US 8,436,756 B2
(45) Date of Patent: May 7, 2013

(54) A/D CONVERSION DEVICE AND SERVO CONTROL DEVICE

(75) Inventors: Yukie Hashimoto, Tokyo (JP); Takamoto Watanabe, Nagoya (JP)

(73) Assignees: Olympus Corporation, Tokyo (JP); Denso Corporation, Kariya-shi, Aichi (JP)

( * ) Notice: Subject to any disclaimer, the term of this patent is extended or adjusted under 35 U.S.C. 154(b) by 225 days.

(21) Appl. No.: 12/955,514

(22) Filed: Nov. 29, 2010

(65) Prior Publication Data
US 2011/0068961 A1 Mar. 24, 2011

Related U.S. Application Data

(63) Continuation of application No. PCT/JP2009/059897, filed on May 29, 2009.

(30) Foreign Application Priority Data

May 30, 2008 (JP) .................................. 2008-143314

(51) Int. Cl.
*H03M 1/06* (2006.01)
(52) U.S. Cl.
USPC ............................ 341/118; 341/155; 341/156
(58) Field of Classification Search .................. 341/155, 341/156, 117–120
See application file for complete search history.

(56) References Cited

U.S. PATENT DOCUMENTS

| 6,654,495 | B1 * | 11/2003 | Katoh et al. | 382/178 |
| 2003/0025625 | A1 | 2/2003 | Mizuno et al. | |
| 2006/0290818 | A1 * | 12/2006 | Asamura et al. | 348/663 |

FOREIGN PATENT DOCUMENTS

| JP | 5-259907 A | 10/1993 |
| JP | 2001-222325 A | 8/2001 |
| JP | 2003-046390 A | 2/2003 |

OTHER PUBLICATIONS

International Search Report of PCT/JP2009/059897, mailing date Jun. 23, 2009.

* cited by examiner

*Primary Examiner* — Jean B Jeanglaude
(74) *Attorney, Agent, or Firm* — Westerman, Hattori, Daniels & Adrian, LLP

(57) ABSTRACT

An A/D conversion device includes an A/D conversion circuit that converts an inputted analog signal to digital data and outputs it, a digital signal correction unit that performs a correction process to the digital data and outputs a digital signal, and a phase compensation unit that performs phase compensation in accordance with a phase delay amount of the digital signal with respect to the analog signal generated in the A/D conversion circuit and the digital signal correction unit wherein the A/D conversion circuit comprises a pulse transit circuit, a transmit position detection structure, and a digital data creation structure, the delay characteristic of the digital data being identified from the inputted analog signal.

6 Claims, 16 Drawing Sheets

|  | P COMPENSATION (PROPORTIONAL) | I COMPENSATION (INTEGRAL) | D COMPENSATION UNIT (DIFFERENTIAL) |
|---|---|---|---|
| TRANSIENT CHARACTERISTIC | ○ | × | ○ |
| STEADY CHARACTERISTIC | — | ○ | × |
| ATTENUATION | × | × | ○ |

○: ENHANCED    ×: REDUCED    —: NO EFFECT

FIG. 11A

| SAMPLING NUMBER k | DIGITAL DATA DT(k) |
|---|---|
| 10 | 2200 |
| 11 | 2345 |

FIG. 11B

| NUMBER | CONVERSION AMOUNT THRESHOLD $\Delta DT\_MAX$ | NUMBER OF SAMPLES m FOR MOVING AVERAGE PROCESS |
|---|---|---|
| 1 | 250 | 2 |
| 2 | 500 | 3 |
| 3 | 1000 | 4 |
| ⋮ | ⋮ | ⋮ |
| x | $\Delta DT(x)$ | y |

FIG. 11C

| SAMPLING CYCLE $T_s$ | GAIN INTERSECTION FREQUENCY $F_m$ | NUMBER OF SAMPLES m | PHASE LEAD AMOUNT $\phi_m$ | CONTINUOUS TIME SYSTEM TRANSFER FUNCTION VARIABLES | | DISCRETE TIME SYSTEM TRANSFER FUNCTION VARIABLES | | |
|---|---|---|---|---|---|---|---|---|
| | | | | $\alpha$ | T | $a_0$ | $a_1$ | $b_1$ |
| 0.00025 | 15 | 2 | 2.7 | 0.91 | 0.01 | 1.10 | -1.07 | 0.98 |

| NUMBER | NUMBER OF SAMPLES m FOR MOVING AVERAGE PROCESS | INPUT SELECTION VARIABLE SW |
|---|---|---|
| 1 | 2 | 1 |
| 2 | 3 | 2 |
| 3 | 4 | 3 |

A/D CONVERSION DEVICE AND SERVO CONTROL DEVICE

TECHNICAL FIELD

The present invention relates to an A/D conversion device and a servo control device that utilizes the A/D conversion device. Priority is claimed on Japanese Patent Application No. 2008-143314, filed May 30, 2008, the content of which is incorporated herein by reference.

BACKGROUND ART

An A/D conversion circuit is used in digital signal processing of information which is sent from various sensors that output analog values, and is used in various devices that include detection circuits, control circuits, and the like. A conventional A/D conversion circuit incorporated in a consumer instrument such as a digital camera compares an analog signal inputted thereto from various sensors with a reference voltage, and binarizes the voltage signal for changing the voltage signal to a digital signal. Moreover, when the change in the analog signal is minor, an analog amplification circuit such as an operational amplifier is used to amplify the analog signal to get the required voltage range, and thereafter the A/D conversion circuit binarizes this signal to get a digital signal.

An A/D conversion device that combines an analog calculating circuit and an A/D conversion circuit has problems of quality and cost. As examples of quality problems, circuit characteristics such as the fluctuate of the amplification rate and the gain due to temperature characteristics which are specific to the analog amplification circuit, making it difficult to obtain a precise output digital signal value, and the power consumed by the entire A/D conversion device increases due to the steady-state current required to drive the analog amplification circuit. An example of a cost problem is that, since a transistor required for the analog amplification circuit has a larger element size than a metal oxide semiconductor (MOS) transistor generally used in digital circuits, the circuit area when integrating on one chip is larger, making it difficult to reduce the cost. Meanwhile, to accompany higher performance of systems in the practical sphere, A/D conversion devices need greater precision, and there is a demand for high bit resolution.

In response to such demands, an time A/D conversion circuit disclosed in Patent Literature 1 employs an entirely digital circuit to constitute a function of encoding a pulse phase difference that includes a ring delay line, a counter, a latch circuit, a pulse selector, and encoder, and a subtraction circuit. According to this technology, since high bit resolution can be realized by an extension of the delay line and the like, a desired bit resolution can be obtained with a digital circuit, without using an analog amplification circuit.

Moreover, since an analog amplification circuit is not used, effects are obtained of maintaining product quality by suppressing change in circuit characteristics affected by temperature characteristics which are unique to the analog circuit, and also of lowering cost as a result of reduced power consumption and higher integration.

PATENT LITERATURE

Japanese Patent Application, First Publication No. 5-259907.

DISCLOSURE OF THE INVENTION

However, when a time A/D conversion circuit is used in a feedback loop of a servo control device, in some cases the feedback control system in the servo control device becomes unstable and oscillates.

This phenomenon is due to phase delay generated in the feedback signal by a signal processing delay arising in the time A/D conversion circuit itself, and in a correction circuit and the like that corrects the signal outputted from the time A/D conversion circuit; hence there is a problem of executing control to stabilize the feedback control system.

The present invention has been realized in view of the above issues, and aims to provide an A/D conversion device that includes a phase compensation function of compensating a phase delay amount generated in an A/D conversion process of an A/D conversion circuit and a digital signal correction process of correcting a signal outputted by the time A/D conversion circuit.

Means for Solving the Problems

The present invention is an A/D conversion device including an A/D conversion circuit that converts an inputted analog signal to digital data and outputs it; a digital signal correction unit that performs a correction process to the digital data and outputs a digital signal, and a phase compensation unit that performs phase compensation in accordance with a phase delay amount of the digital signal with respect to the analog signal generated in the A/D conversion circuit and the digital signal correction unit.

Preferably, the A/D conversion circuit of the invention includes a pulse transit circuit, a transmit position detection structure and a digital data creation structure. A plurality of inversion circuits including logical elements wherein the delay time between an input signal and an output signal changes in accordance with the size of an applied power or electrical current is connected to the pulse travel circuit, and an activation signal for starting a pulse signal is inputted to one of the inversion circuits is input to the pulse travel circuit. The transmit position detection structure detects a transit position of the pulse signal in the pulse transit circuit based on the output signals from the inversion circuits, and generates data in accordance with the transit position. The digital data creation structure creates digital data corresponding to the size of the power or the electrical current that changes in accordance with the inputted analog signal based on the data outputted from the transmit position detection structure. In the A/D conversion circuit, delay characteristic of the digital data being identified from the inputted analog signal.

Preferably, in the phase compensation unit of the present invention, the characteristic of the phase compensation is changed based on an inputted characteristics setting signal.

Preferably, in the digital signal correction unit of the present invention, based on an inputted characteristics setting signal, the characteristic of the correction process is changed, and the delay characteristic generated by the correction process is defined.

Preferably, the A/D conversion device of the present invention includes an upper controller that, based on the state of data outputted from the A/D conversion circuit, correlates and changes the characteristic of a correction process of the digital signal correction unit and the phase compensation characteristic of the phase compensation unit.

The present invention can also provide a servo control device in which the A/D conversion device is inserted into a feedback control loop.

Preferably, the A/D conversion device of the present invention is inserted on a feedback path within the feedback control loop, and performs a phase compensation process of a feedback signal.

Effects of the Invention

The A/D conversion device of the present invention includes a phase compensation unit that performs phase compensation in accordance with a phase delay amount of the digital signal with respect to the analog signal generated in the A/D conversion circuit and in the digital signal correction unit. Consequently, the A/D conversion device of the present invention has a function of performing a signal process of correcting an error signal generated during an A/D conversion process, and a phase compensation function of compensating the delay of the signal in conversion and correction processes. Therefore, an inputted analog signal can be converted conversion circuit to a digital signal in the A/D, this digital signal can be corrected in a digital signal correction unit of a later stage, and fluctuation in the delay time can be subjected to perform phase compensation as necessary in a phase compensation unit.

Furthermore, in the above invention, the A/D conversion circuit of the present invention can include a pulse transit circuit, a transit position detection structure, and a digital data creation structure. In this case, the pulse transit circuit includes a plurality of linked inversion circuits including logical elements which change in accordance with the size of an applied power or electrical current wherein the delay time between an input signal and an output signal is applied, and an activation signal for starting a pulse signal is inputted to one of the inversion circuits. The transmit position detection structure detects a transit position of the pulse signal in the pulse transit circuit based on the output signals from the inversion circuits, and generates data in accordance with the transit position. Based on the data outputted from the transmit position detection structure, the digital data creation structure creates digital data corresponding to the size of the power or the electrical current that changes in accordance with the inputted analog signal. The delay characteristic of the digital data is identified from the inputted analog signal. Therefore, a time A/D conversion-type A/D conversion circuit can be used as the A/D conversion circuit, and a high-resolution A/D conversion process can be performed. Moreover, it is possible to identify a delay time when the inputted analog signal is converted to the digital signal by the A/D conversion circuit.

Furthermore, in the above invention, in the phase compensation unit of the present invention, the characteristic of the phase compensation can be changed based on an inputted characteristics setting signal. Therefore, the characteristic of the phase compensation unit can be changed by inputting this characteristics setting signal. Also, utilizing the flexibility of the phase compensation unit formed by a digital circuit, the phase compensation unit of the present invention can be used in a device having a different loop gain without changing the hardware configuration of the time A/D conversion device.

Furthermore, in the above invention, in the digital signal correction unit of the present invention, the characteristic of the correction process can be changed based on an inputted characteristics setting signal, and the delay characteristic generated by the correction process can be identified. Therefore, the characteristic of the digital signal correction unit can be changed by inputting this characteristics setting signal. Also, even if the characteristic of the digital signal correction unit is changed, the delay time of the digital signal correction unit can be identified, and the phase compensation unit can execute phase compensation in accordance with the delay time.

Furthermore, in the above invention, the A/D conversion device of the present invention can further include an upper controller that correlates and changes the characteristic of a correction process of the digital signal correction unit and the characteristic of the phase compensation unit based on the state of data outputted from the A/D conversion circuit. Therefore, since the characteristic of the digital signal correction unit and the characteristic of the phase compensation unit can be changed as necessary in accordance with the state of the inputted signal, it is possible to detect whether an input signal with an abnormal value has been inputted to the A/D conversion device, and perform a process to reduce the effects of the abnormal signal as necessary. Also, even if the characteristics of the system fluctuate, control can be executed in accordance with this fluctuation.

Furthermore, in the servo control device of the present invention, the A/D conversion device can be inserted into a feedback control loop. Therefore, after an A/D conversion circuit converts the inputted analog signal to a digital signal, a digital signal correction unit of a later stage corrects variation in the digital signal, and a phase compensation unit performs phase compensation as necessary, the signal can then be inserted into the feedback control loop of the servo control device.

Furthermore, the A/D conversion device of the present invention can be inserted into a feedback path within the feedback control loop, where it performs phase compensation process of the feedback signal. Therefore, in the phase compensation circuit, since signal delay due to the A/D conversion process is compensated by lead compensation, the signal delay amount can be reduced, and a feedback control signal with little delay can be created. Furthermore, even if a detection signal is inputted from a sensor that has detected various disturbance signals, the A/D conversion device can perform an adaptive disturbance suppression process, and the servo control device can be stabilized.

BRIEF DESCRIPTION OF THE DRAWINGS

FIG. 11A is a schematic diagram of a data configuration and data examples in an inputted signal table that stores digital signals inputted to an upper controller 24 according to a second embodiment.

FIG. 11B is a schematic diagram of a data configuration and data examples in a number-of-samples selection table according to a second embodiment.

FIG. 11C is a schematic diagram of a data configuration and data examples in a variables selection table according to a second embodiment.

BEST MODES FOR CARRYING OUT THE INVENTION

First Embodiment

A first embodiment of the present invention will be explained with reference to the drawings.

Figure 1:
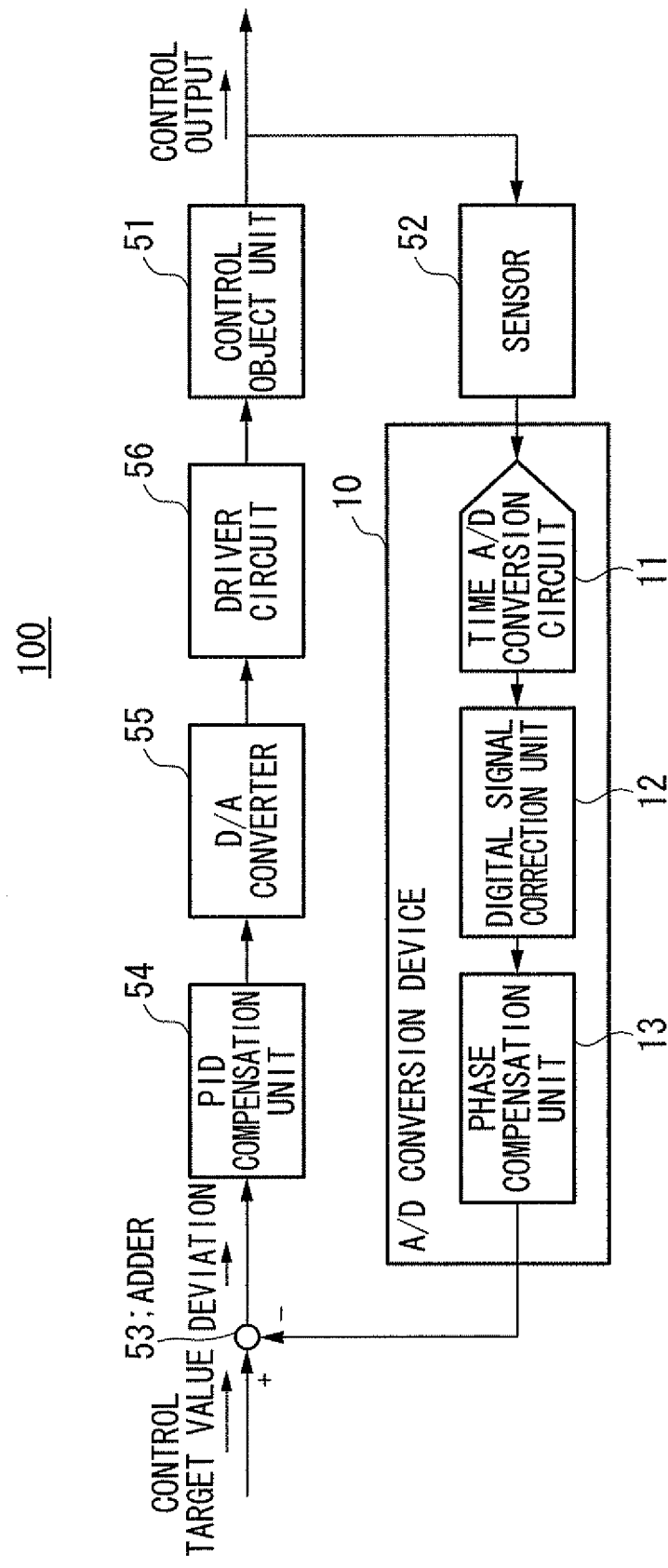
FIG. 1 is a block diagram of a feedback control device according to a first embodiment.

FIG. 1 is a block diagram of a feedback control device 100. The feedback control device 100 includes a controlled object unit 51, a sensor 52, an analog/digital (A/D) conversion device 10, an adder 53, a proportional/integral/differential (PID) compensation unit 54, a digital/analog (D/A) converter 55, and a driver circuit 56. In the feedback control device 100, the controlled object unit 51 is controlled in accordance with an inputted manipulation amount, and, as a result of that control, indicates a controlled object that outputs a predetermined physical amount as a control output. The control output which is outputted from the controlled object unit 51 is controlled by a feedback control system, such that the sensor 52 that outputs in accordance with a desired target value inputted to the feedback control device 100 is attached to the controlled object unit 51, detects the physical amount that becomes the control output of the controlled object unit 51, and converts it to an analog signal before outputting it. The physical amount detected by the sensor 52 is information such as position, speed, and acceleration speed, the sensor for use being selected in accordance with the detected information.

An analog signal which is detected and outputted by the sensor 52 is inputted to the A/D conversion device 10. The A/D conversion device 10 converts the analog signal to a digital signal, performs a digital signal process to the converted digital signal, and outputs it. The adder 53 subtracts a value, which is outputted from the A/D conversion device 10 and fed back from the controlled object unit 51, from a desired target value of the control output of the controlled object unit 51 inputted to the feedback control device 100, and outputs the difference as a deviation.

The PID compensation unit 54 makes the deviation which is inputted from the adder 53, and outputs a result calculated by an arithmetic operation defined with an existing value as a manipulation amount. The arithmetic operation defined in the PID compensation unit 54 is a PID arithmetic operation used as a controller of the control system. The D/A converter 55 converts the digital signal inputted from the PID compensation unit 54 to a analog signal, and outputs it. Based on an inputted signal, the driver circuit 56 outputs a manipulation amount required by the controlled object unit 51.

The manipulation amount inputted to the driver circuit 56 is sometimes converted to a modulated signal by using pulse width modulation (PWM) or the like. This sort of conversion enables the manipulation amount to be indicated by a pulse signal as in PWM modulation, making it unnecessary to apply the manipulation amount as an analog amount to the controlled object. Therefore, when the manipulation amount can be inputted using a pulse signal in the manner described above, the pulse signal can be inputted to the driver circuit 56 without using the D/A converter 55 to convert it to an analog value.

The A/D conversion device 10 in the feedback control device 100 includes a time A/D conversion circuit 11, a digital signal correction unit 12, and a phase compensation unit 13. In the A/D conversion device 10, an inputted analog signal is inputted to the time A/D conversion circuit 11. The time A/D conversion circuit 11 quantizes the inputted analog signal, converts it to a digital signal, and outputs it. The digital signal outputted by the time A/D conversion circuit 11 contains quantization error appended during quantization, signal conversion error, nonlinearity error appended during quantization, and such like. The digital signal outputted from the time A/D conversion circuit 11 is inputted to the digital signal correction unit 12. The digital signal correction unit 12 performs a correction process of the error signal contained in the inputted digital signal, and outputs a corrected signal. The phase compensation unit 13 performs a predetermined arithmetic operation to compensate a phase delay amount for the input signal that is appended in the conversion process of the time A/D conversion circuit 11 and the signal process of the digital signal correction unit 12 provided in the A/D conversion device 10, i.e. a phase delay amount of the digital signal outputted from the A/D conversion device 10 with respect to the inputted analog signal, thereby reducing the phase delay amount and outputting it as a digital signal.

Figure 2:
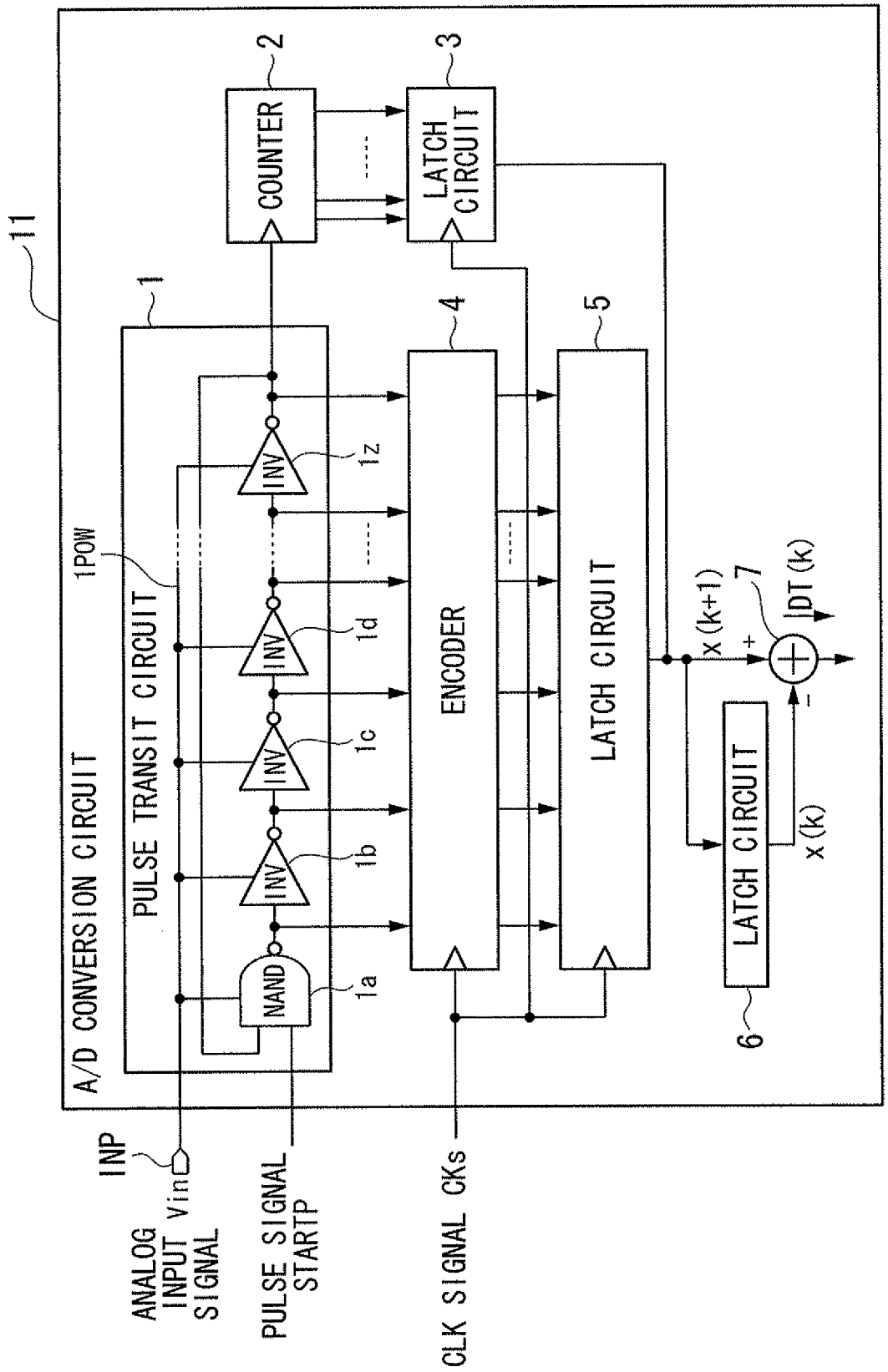
FIG. 2 is a block diagram of a time A/D conversion device according to a first embodiment.

Subsequently, the time A/D conversion circuit 11 in the A/D conversion device 10 will be explained. FIG. 2 is a block diagram of the time A/D conversion circuit 11 in the A/D conversion device 10. In the time A/D conversion circuit 11, a pulse transit circuit 1 includes a NAND circuit 1a and a plurality of inverter circuits 1b to 1z (INV). The NAND circuit 1a is an inversion circuit for activation that operates after receiving a pulse signal StartP at one input terminal; the output of an inverter in the last stage of the plurality of inverter circuits 1b to 1z (INV), which are connected in series to the output of the NAND circuit 1a, is connected to the other input terminal, forming a circulation circuit wherein the pulse transit circuit 1 is connected in a ring shape. An input terminal INP of the time A/D conversion circuit 11 is connected via a power line 1POW to the power terminals of the NAND circuit 1a and the plurality of inverter circuits 1b to 1z (INV). The delay times of the respective circuits vary depending on the voltage of the analog input signal $V_{in}$ inputted to the input terminal INP, thereby varying the circulation cycle of the pulse going around the circulation circuit. A counter 2 detects a signal having circulation cycle information inputted from the pulse transit circuit 1, and measures the number of circulations of the pulse. A latch circuit 3 holds the signal inputted from the counter 2 at a timing of the clock signal.

An encoder 4 detects the position of the pulse going around at the pulse transit circuit 1, converts the position information of the pulse to a binary number, and outputs it. A latch circuit 5 holds the output signal from the encoder 4 at a timing of the clock signal. A latch circuit 6 assigns the output signal from the latch circuit 5 to the lower bit and assigns the output signal from a latch circuit 3 to the upper bit, and holds the inputted signals at a timing of the clock signal. An arithmetic device 7 subtracts the output signal from the latch circuit 6 for input to a second input terminal from the input signal to the latch circuit 6 for inputting to a first input terminal.

Subsequently, an operation of the time A/D conversion circuit 11 will be explained. In the time A/D conversion circuit 11, the pulse transit circuit 1 is a circulating circuit formed in a ring shape including one NAND circuit 1a (NAND) and a plurality of inverter circuits 1b to 1z (INV). The pulse signal StartP is circulated along the ring-shaped circulating circuit. In the pulse transit circuit 1, in accordance with the value of the analog input signal $V_{in}$ inputted to the time A/D conversion circuit 11, the delay times of the NAND circuit 1a (NAND) and the plurality of inverter circuits 1b to 1z (INV) that form the circulating circuit continuously change, and the circulation speed of the pulse signal StartP also changes. The counter 2 counts the number of circulations that the pulse signal StartP in the pulse transit circuit 1 makes around the circulating circuit including the NAND circuit 1a (NAND) and the inverter circuits 1b to 1z (INV), and outputs this number as binary digital data. The latch circuit 3 holds the digital data inputted from the counter 2 in synchronism with a CLK signal CKs indicating a sampling cycle.

Meanwhile, in synchronism with the CLK signal CKs, the encoder 4 detects which position the pulse signal StartP in the pulse transit circuit 1 is circulating in the NAND circuit 1a (NAND) and the inverter circuits 1b to 1z (INV) which configure the pulse transit circuit 1, and outputs the detected position as binary digital data. Since the circulation cycle that changes depending on the value of the inputted analog input signal $V_{in}$ and the cycle detected in synchronism with the CLK signal CKs indicating the sampling cycle are asynchronous, the position of the pulse signal StartP in the pulse transit circuit 1 detected by the encoder 4 changes each time it is detected. The latch circuit 5 holds the digital data inputted from the encoder 4 in synchronism with the CLK signal CKs.

The latch circuit 6 assigns the digital data inputted from the latch circuit 3 as the upper bit, and the digital data inputted from the latch circuit 5 as the lower bit, and holds them in synchronism with the CLK signal CKs. Synthesizing the digital data inputted to the latch circuit 6 as the upper bit and the lower bit creates binary digital data x(k) that corresponds to the inputted analog input signal $V_{in}$ that was sampled in the cycle of the CLK signal CKs. The arithmetic device 7 subtracts the digital data x(k), which was sampled in the CLK signal CKs(k) of the preceding cycle and held by the latch circuit 6 before being outputted, from the digital data x(k+1) that the latch circuits 4 and 5 input to the latch circuit 6; it then creates digital data DT(k) for output from the A/D conversion circuit, and outputs to an external circuit of a later stage. The time A/D conversion circuit 11 described above outputs digital data DT(n) corresponding to the inputted analog input signal $V_{in}$ in cycles (DT(1), DT(2), DT(3), . . . , DT(n)) in accordance with the cycle of the CLK signal CKs.

Figure 3A:
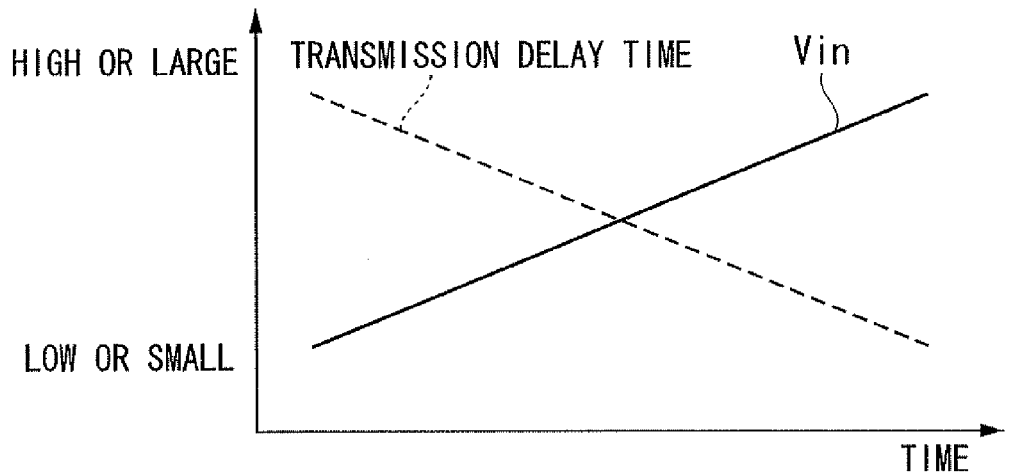
FIG. 3A is a graph showing the relationship between an analog input signal $V_{in}$ and the propagation delay time of a pulse signal StartP in a pulse transit circuit 1 in regard to the operation of a time A/D conversion device according to a first embodiment.
Figure 3B:
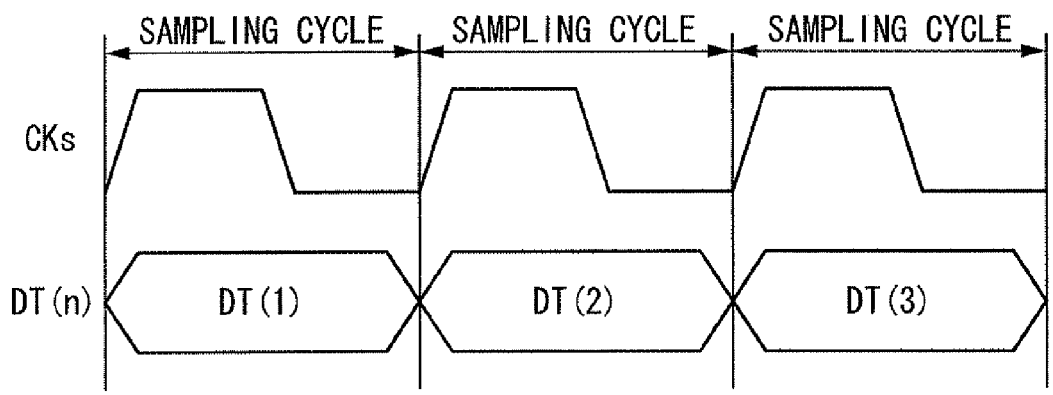
FIG. 3B is a timing chart showing the relationship between an inputted CLK signal CKs, and digital data DT(n) outputted in that cycle, in regard to the operation of a time A/D conversion device according to a first embodiment.

FIG. 3A is a graph showing the relationship between the analog input signal $V_{in}$ and the propagation delay time of the pulse signal StartP in the pulse transit circuit 1. According to this graph, the higher the potential of the analog input signal Vin, the shorter the propagation delay time of the pulse signal StartP. FIG. 3B is a timing chart showing the relationship between the inputted CLK signal CKs and the digital data DT(n) outputted in accordance with the cycle of the CLK signal CKs. According to this timing chart, at the rise of the inputted CLK signal CKs, the output of the latch circuit 6 that outputs the digital data DT(n) changes, and is output as an output signal of the time A/D conversion circuit 11. This A/D conversion process of the time A/D conversion circuit 11 generates a delay of three clocks of the sampling cycle.

Figure 4:
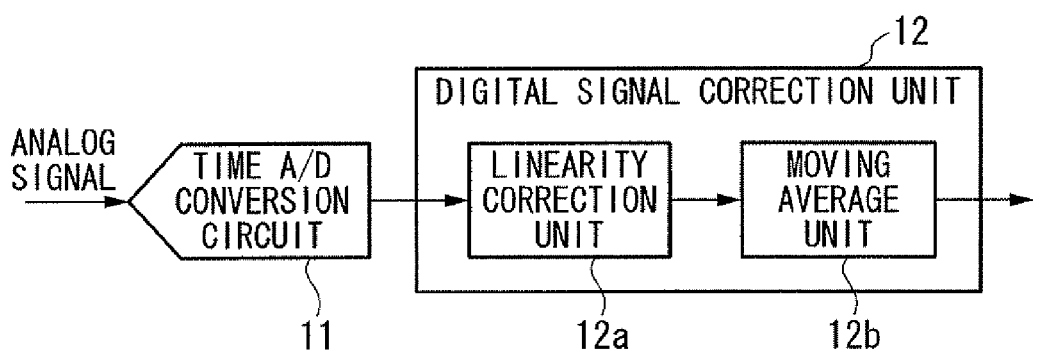
FIG. 4 is a block diagram of a digital signal correction unit according to a first embodiment.

Referring to FIG. 4, the digital signal correction unit 12 in the A/D conversion device 10 will be explained. FIG. 4 is a block diagram showing the digital signal correction unit 12 connected to the output of the time A/D conversion circuit 11 in the A/D conversion device 10, and the connection configuration of the digital signal correction unit 12 and the time A/D conversion circuit 11. The digital signal correction unit 12 includes a linearity correction unit 12a and a moving average unit 12b. In the digital signal correction unit 12, the linearity correction unit 12a performs an arithmetic operation to correct nonlinearity error appended during the quantization process of the analog signal in the time A/D conversion circuit 11, and reproduces/outputs as a signal with enhanced linearity. The linearity correction unit 12a uses linear approximation to define characteristics for enhancing the linearity of the digital input signal, and performs an arithmetic operation of linearity correction to convert it to a digital output signal with enhanced linearity. This linearity correction process is performed intermittently without switching the process during operation for every piece of inputted information. The delay time is fixedly generated in accordance with the cycle of inputted data, i.e. the sampling cycle of the time A/D conversion circuit 11.

The moving average unit 12b performs a arithmetic operation to average conversion error and quantization error appended during quantization of the analog signal in the time A/D conversion circuit 11, and reduces random disturbance information contained in the inputted signal. Based on sequentially inputted information (samples), the moving average unit 12b performs a moving average process of computing an average value of a desired number of pieces of the information (samples). The delay time generated by this moving average process depends on the number of samples that are subjected to the averaging process, and is a multiple of the number of samples in a sampling cycle. Through these processes, the digital signal correction unit 12 corrects the nonlinear characteristic created in the time A/D conversion circuit 11, and outputs with a linear characteristic.

Figure 5A:
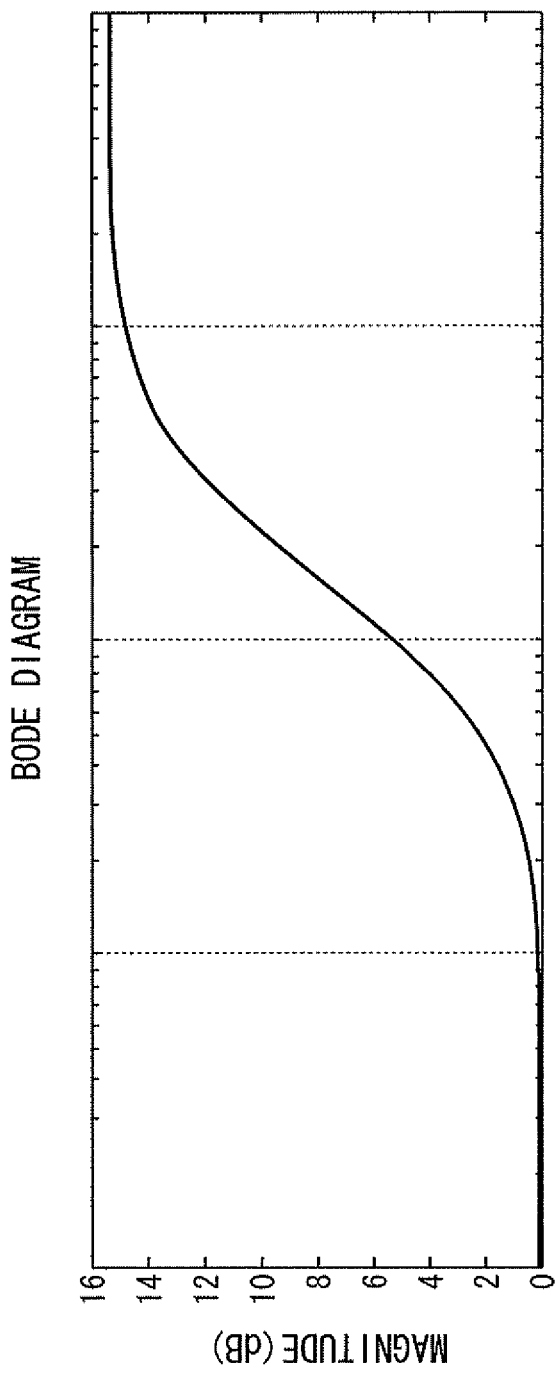
FIG. 5A is a graph showing gain characteristics of a phase correction unit according to a first embodiment.
Figure 5B:
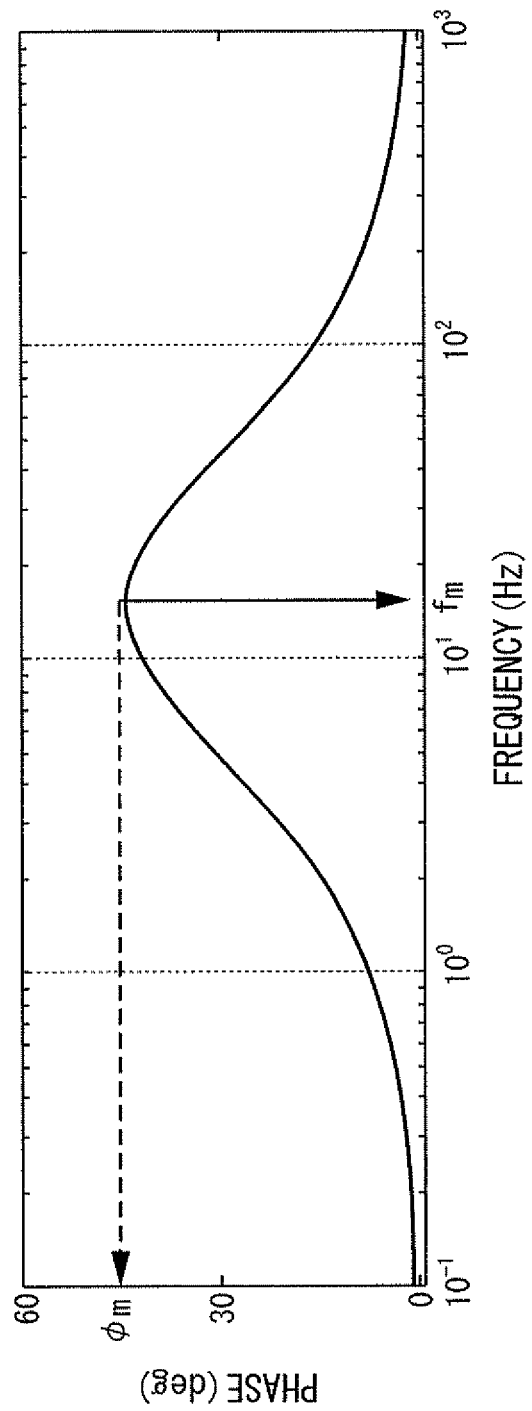
FIG. 5B is a graph showing phase characteristics of a phase compensation unit according to a first embodiment.
Figure 6:
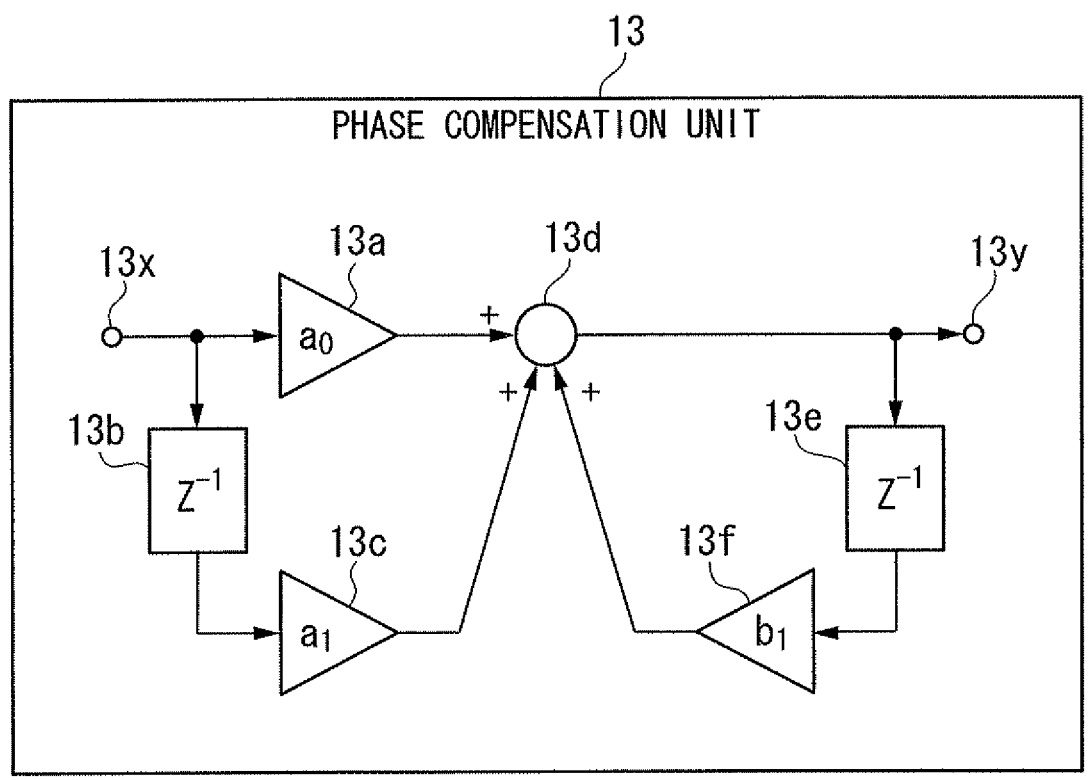
FIG. 6 is a block diagram showing a phase compensation unit according to a first embodiment.

Referring to FIGS. 5 and 6, the phase compensation unit 13 will be explained. FIGS. 5A and 5B are graphs showing desired frequency response characteristics of the phase compensation unit 13, their vertical axes representing gain characteristic and phase characteristic respectively. The horizontal axes in the graphs of FIGS. 5A and 5B are frequency axes indicating the frequency of a signal being processed, in Hertz (Hz). The vertical axes respectively represent the gain in decibels (dB) and the phase angle in degrees. The frequency characteristic shown in FIGS. 5A and 5B is one with high gain in the high-frequency component of the inputted signal, and 'lead compensation' that leads the phase of the inputted signal. This frequency characteristic is expressed as a transmission function F(s) in a continuous time system in the following equation (1).

$$F(s) = \frac{T_m \cdot s + 1}{\alpha T_m \cdot s + 1} \quad (1)$$

In equation (1), s is a Laplace operator, α is a variable shown in equation (2), and $T_m$ is a variable shown in equation (3).

$$\alpha = \frac{1 - \sin\phi_m}{1 + \sin\phi_m} \quad (2)$$

In equation (2), $\phi_m$ is a value of the maximum phase angle (phase lead amount).

$$T_m = \frac{1}{2\pi\sqrt{\alpha}\, f_m} \quad (3)$$

In equation (3), $f_m$ is the frequency that shows the maximum phase lead angle. Incidentally, $f_m$ is set to a gain intersection frequency, obtained by a feedback control stability determination, from a frequency characteristic of a loop transfer function of the feedback control device 100 in FIG. 8 explained below. In the graphs shown in FIGS. 5A and 5B, the gain intersection frequency $f_m$ is 15 Hz (Hertz), and the phase lead angle $\phi_m$ at the gain intersection frequency $f_m$ is 45 degrees. Using this transmission characteristic of a continuous time system, a desired phase compensation characteristic can be identified.

Subsequently, there will be explained a case where a bilinear transform process is used as an approximation method when performing a discrete time system process (digital filter) to realize the transmission characteristic in a continuous time system. In equation (4) below, bilinear transform is performed to convert the transmission function shown in equation (1) to a transmission function F(z) in a discrete time system.

$$F(z) = \frac{\frac{2T_m + T_s}{2\alpha T_m + T_s} + \frac{-2T_m + T_s}{2\alpha T_m + T_s} \cdot z^{-1}}{1 - \left(-\frac{-2\alpha T_m + T_s}{2\alpha T_m + T_s}\right) \cdot z^{-1}} \quad (4)$$

In equation (4), z is a lead operator, and $z^{-1}$ signifies a delay operation process. $T_s$ is the sampling cycle (in seconds). Equation (5) below expresses the relationship between the sampling frequency $f_s$ (Hz: Hertz) and the sampling cycle $T_s$ (sec). The sampling frequency $f_s$ is the same value as the sampling frequency in the time A/D conversion circuit 11.

$$T_s = \frac{1}{f_s} \quad (5)$$

Using variables defined by equations (6) to (8), the equation (4) can be converted to equation (9).

$$a_0 = \frac{2T_m + T_s}{2\alpha T_m + T_s} \quad (6)$$

$$a_1 = \frac{-2T_m + T_s}{2\alpha T_m + T_s} \quad (7)$$

$$b_1 = -\frac{-2\alpha T_m + T_s}{2\alpha T_m + T_s} \quad (8)$$

$$F(z) = \frac{Y}{X} = \frac{a_0 + a_1 \cdot z^{-1}}{1 - b_1 \cdot z^{-1}} \quad (9)$$

FIG. 6 is a block diagram of the phase compensation unit 13 when the phase compensation characteristic shown in FIG. 5 is formed using a digital filter. In the phase compensation unit 13, multipliers 13a, 13c, and 13f respectively multiple a signal which gains $a_0$, $a_1$, and $b_1$ are inputted, and output the result. One-sample delay elements 13b and 13e output signals that are delayed from the input signal by one clock portion of the sampling frequency. An adder 13d adds the signals inputted from its three input terminals, and outputs them.

Subsequently, the connections of the constituent parts in the phase compensation unit 13 will be explained. The input terminal of the multiplier 13a is connected to an input terminal 13x, and its output terminal is connected to a first input terminal of the adder 13d. The input terminal of the one-sample delay element 13b is connected to the input terminal 13x, and its output terminal is connected to the input terminal of the multiplier 13c. The input terminal of the multiplier 13c is connected to the output terminal of the one-sample delay element 13b, and its output terminal is connected to a second input terminal of the adder 13d. The input terminal of the one-sample delay element 13e is connected to an output terminal 13y, and its output terminal is connected to the output terminal of the multiplier 13f. The input terminal of the multiplier 13f is connected to the output terminal of the one-sample delay element 13e, and its output terminal is connected to the input terminal of the adder 13d. The first input terminal of the adder 13d is connected to the output terminal of the multiplier 13a, its second input terminal is connected to the output terminal of the multiplier 13c, its third input terminal is connected to the output terminal of the multiplier 13f, and its output terminal is connected to the output terminal 13y. The phase compensation unit 13 has the characteristics of the transmission function shown above in equation (9).

In the A/D conversion device 10 shown above, the phase delay amount output as a digital signal after digitally converting an inputted analog signal can be compensated by a determined arithmetic process, whereby a digital signal with reduced phase delay amount can be output.

Subsequently, an application of the A/D conversion device 10 in a feedback control device 100 will be explained. Among the constituent components of the feedback control device 100, those having characteristics that depend on the signal frequency are, in addition to the A/D conversion device 10 already mentioned, the control object unit 51 and the PID compensation unit 54. The frequency characteristics of the control object unit 51 can be modeled by executing an identification of the system focusing on distinctive operations among the operational characteristics in actual operations, and defined as representative characteristics of the control object unit 51 based on the characteristics of the model identifying the system.

Subsequently, referring to FIG. 7, the PID compensation unit 54 having frequency characteristics will be explained. FIG. 7A is a block diagram of the PID compensation unit 54. The PID compensation unit 54 includes three compensation operation elements and an adder 54d that adds manipulation amounts that the compensation operation elements output. The three compensation operation elements are a P compensation unit 54a, an I compensation unit 54b, and a D compensation unit 54c; the manipulation amounts they output are formed by linear coupling in the adder 54d. The P compensation unit 54a outputs a manipulation amount proportional to the deviation, the I compensation unit 54b outputs a manipulation amount which is an integral of the deviation, and the D compensation unit 54c outputs a manipulation amount which is a differential of the deviation.

Figures 7A, 7B:
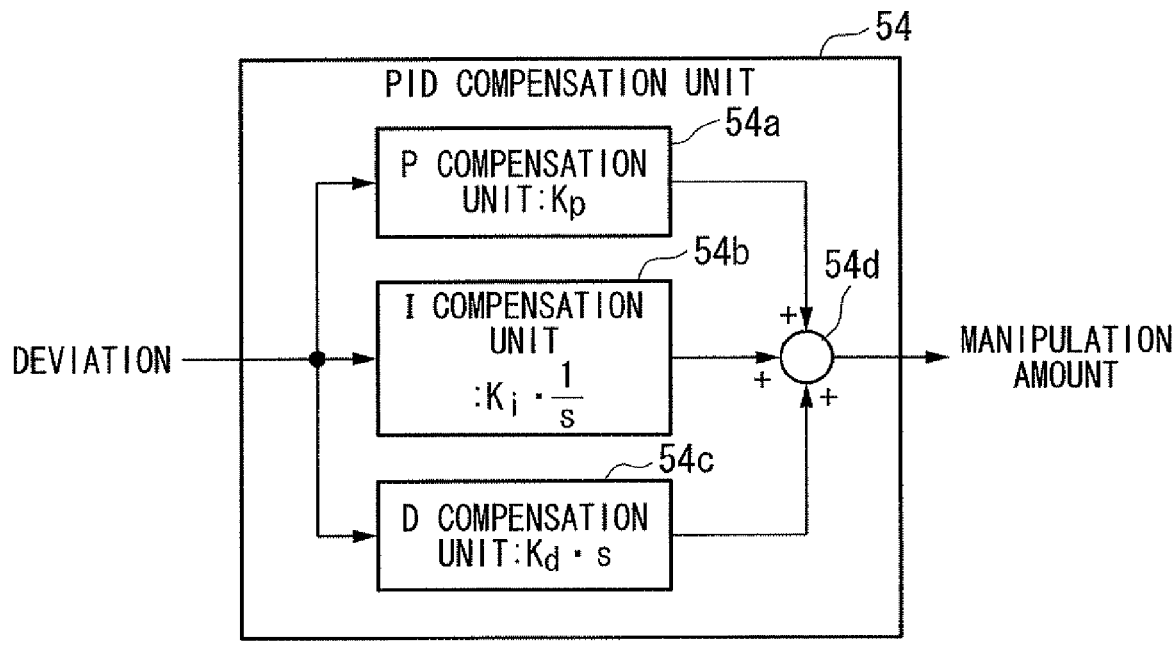
FIG. 7A is a block diagram showing a PID compensation unit according to a first embodiment.
FIG. 7B is a diagram showing characteristics of various compensation components of a PID compensation unit according to a first embodiment.

FIG. 7B shows the characteristics of the compensation elements. The transient characteristic in a feedback control system is enhanced by the action of the P compensation unit 54a and the D compensation unit 54c, and has an effect of accelerating the responsivity of the system until the target value is reached. The steady characteristic in a feedback control system is enhanced by the action of the I compensation unit 54b, and has effects of eliminating deviation from the target and achieving a match between the target value and the control output. The attenuation characteristic in a feedback control system is enhanced by the action of the D compensation unit 54c, and has an effect of suppressing oscillatory fluctuation of the control output generated by factors such as disturbance and noise. On the other hand, if the proportional gain in the P compensation unit 54a or the differential gain in the D compensation unit 54c is too large, the control system may become unstable. The compensation operation elements, which have mutually different characteristics, are used in a feedback control system for PID compensation that combines their characteristics, achieving a balance between the transient characteristic, the steady characteristic, and attenuation, and thereby enhancing the overall characteristics of the system. The characteristics of the PID compensation unit 54 can be set independently from the characteristics set in the phase compensation unit 13 in the A/D conversion device 10.

Subsequently, an operation of the feedback control device 100 will be explained. In the feedback control device 100, a control signal representing a control amount suitable for controlling a target object is inputted to the control object unit 51. The control object unit 51 then executes control in accordance with the inputted control amount. The sensor 52 for detecting and outputting a physical amount indicating control output is attached to the control object unit 51. The A/D conversion device 10 is connected to the sensor 52, and the physical amount detected by the sensor 52 is inputted the A/D conversion device 10 as an analog signal. The A/D conversion device 10 converts the inputted analog signal to a digital signal, which is inputted to the adder 53.

The adder 53 subtracts the digital signal (feedback signal) inputted from the A/D conversion device 10 from the inputted control target value to determine the deviation, and inputs this deviation to the PID compensation unit 54 connected to the adder 53. The D/A converter 55 is connected to the PID compensation unit 54; the PID compensation unit 54 creates information representing a manipulation amount to the control object 51 to perform a PID compensation process to the deviation, and then inputs the created information to the D/A converter 55. The D/A converter 55 converts the inputted information to an analog value, and inputs this to the driver circuit 56 connected to the D/A converter 55. The driver circuit 56 inputs a control amount indicated by the inputted analog value to the control object unit 51 which is connected to the driver circuit 56.

In the A/D conversion device 10, the analog signal inputted from the sensor 52 is inputted to the time A/D conversion circuit 11, which converts the analog signal to digital data and inputs this to the digital signal correction unit 12. The digital signal correction unit 12 subjects the inputted digital data to a linearity compensation process in the linearity correction unit 12a, subjects the linearity-compensated signal to a moving average process in the moving average unit 12b, and inputs it to the phase compensation unit 13 which is connected to the digital signal correcting unit 12. The moving-averaged signal is inputted to the phase compensation unit 13, which subjects the phase delay created in the time A/D conversion circuit 11 and the digital signal correcting unit 12 to a phase compensation process, and outputs it as a compensated digital signal.

By multiplying the frequency characteristics of the A/D conversion device 10, the control object unit 51, and the PID compensation unit 54 in the feedback control device 100 with the value of the constant gain of the other components, the frequency characteristics (loop transfer function) of the feedback control device 100 can be determined. In deciding the frequency characteristics of the feedback control system in the feedback control device 100, each constant is set with due consideration for achieving a balance between the stability and the responsivity of the feedback control system.

Subsequently, a method of determining the stability of the feedback control system in the feedback control device 100 will be explained. There are several known methods of determining the stability of a feedback control system. Here, stability is determined with a determining method that uses the frequency characteristics in a continuous time system. According to this determining method, to stabilize the feedback control system, a phase margin PM must be obtained in the phase characteristic at a gain intersection frequency $f_m$ where the gain characteristic of the entire system (loop transit function) is nearly 0 dB (decibels). The phase margin PM expresses the phase at gain intersection frequency $f_m$ as the value of a lead angle which goes by the phase delay amount 180 degrees (phase angle—180 degrees). A lead angle of the phase can be obtained by leading the phase delay amount further than 180 degrees. Here, if the value of a threshold in determining the stability of the feedback control system is 0 degrees, when the feedback control system is stable, the phase margin has a value that exceeds 0 degrees (positive value), whereas when the feedback control system is unstable, the phase margin has a value of 0 or less (negative value).

Figure 8:
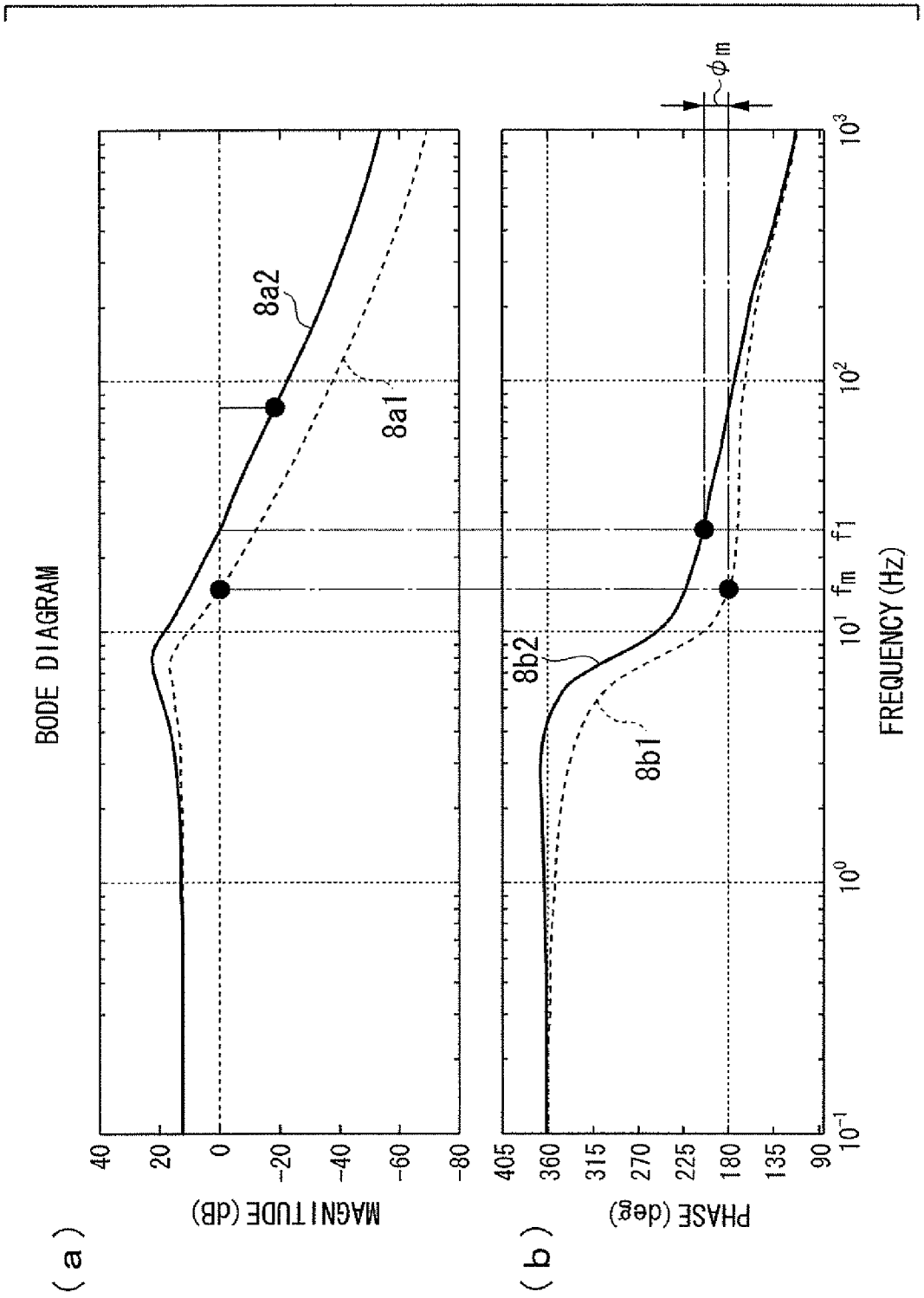
FIG. 8(a) is a graph showing gain characteristics of a feedback control device according to a first embodiment.
FIG. 8(b) is a graph showing phase characteristics of a feedback control device according to a first embodiment.

Referring to FIG. 8, a stability determination of the feedback control system using the A/D conversion device 10 in the feedback control device 100 will be explained. FIG. 8(a) and (b) show frequency characteristics of the loop transfer function of the feedback control device 100, the vertical axes respectively representing the gain characteristic and the phase characteristic. The horizontal axes are frequency axes representing the signal frequency of the feedback control system in Hz (Hertz). The vertical axes respectively represent the gain in dB (decibels) and the phase angle in degrees.

Graph 8a1 and graph 8b1 show the state where it a stability determination of the feedback control system determines that it is unstable. In a feedback control system in this state, abnormal oscillation may occur. The state shown in graph 8a1 and graph 8b1 is one where phase compensation has not been performed at the A/D conversion device 10. In graph 8a1, at the gain intersection frequency $f_m$ (approximately 15 Hz (Hertz)) where the gain value is 0 dB (decibels), the value of the phase in graph 8b1 is almost 180 degrees. That is, the phase margin angle is almost 0 degrees, indicating that a phase margin is not being maintained.

Here, using the phase compensation function of the phase compensation unit 13 of the A/D conversion device 10, a phase compensation amount is set such as to secure the stability level of the feedback control system in the feedback control device 100.

In phase compensation executed in the A/D conversion device 10, the phase delay amount shown in graph 8a1 of FIG. 8(a) is used as a reference. The next value shown in graph 8a1 representing this reference state becomes a condition for determining the phase compensation amount. The value is the phase lead amount $ø_m$ required for stabilizing the system, and the gain intersection frequency $f_m$ that defines that phase lead amount. The graph in FIG. 8 indicates that the required phase lead amount $ø_m$ and the gain intersection frequency $f_m$ have the conditions shown by the following equations (10) and (11).

$$ø_m = 45 \text{ (degrees)} \quad (10)$$

$$f_m = 15 \text{ (Hz)} \quad (11)$$

Referring to equations (1) to (9) on the basis of the conditions shown in equations (10) and (11), the variables of a phase lead compensation process of the phase compensation unit 13 are determined. The variables α and $T_m$ of a continuous transfer function F(s) can be determined using the function scheme shown in equations (2) and (3), in compliance with the phase lead amount $ø_m$ and the gain intersection frequency $f_m$ shown in equations (10) and (11).

In FIG. 8, graph 8a2 and graph 8b2 show frequency response characteristics when the loop transfer function of the feedback control device 100 has been revised by performing phase compensation in the phase compensation unit 13 in the A/D conversion device 10 in accordance with the above-mentioned variables. Graphs 8a2 and 8b2 show that this phase compensation can secure a phase margin. As explained above, in the graph 8a1 shown before performing phase lead compensation using the A/D conversion device 10, the phase margin near a gain intersection frequency of 15 Hz (Hertz) is nearly 0 degrees. In graph 8a2 and graph 8b2, in which the characteristics shown in graph 8a1 have been revised by phase compensation, due to the effect of phase lead compensation by the A/D conversion device 10, near 15 Hz (Hertz), which was the gain intersection frequency $f_m$ before phase compensation, the phase can be lead by approximately 45 degrees, while near 25 Hz (Hertz), which is the new gain intersection frequency $f_m$ in the loop transfer characteristics revised by phase compensation, a phase margin of approximately 25 degrees is obtained.

As shown above, by performing 'lead compensation' that leads the phase of the signal in the A/D conversion device 10 arranged on the feedback path of the feedback control device 100, the feedback control characteristics can be enhanced and stabilized. By using the A/D conversion device 10 arranged on the feedback path in conjunction with the PID compensation unit 54 to compensate the control characteristics with respect to the control object unit 51, when creating a manipulation amount from the feedback amount and the control target value, it becomes possible to give mutually independent phase characteristics to the feedback amount and the control target value, allowing greater freedom when deciding the feedback control characteristics. The time A/D conversion circuit 11 converts an inputted analog signal to a digital signal, the digital signal correcting unit 12 of a later stage corrects variation in the digital signal, and the phase compensation unit 13 performs an applicable phase compensation, whereby it becomes possible to provide a more accurate A/D conversion device 10.

Second Embodiment

In a second embodiment, an embodiment that enables the characteristics of the phase compensation unit in an A/D conversion device 20 to be modified will be explained.

Figure 9:
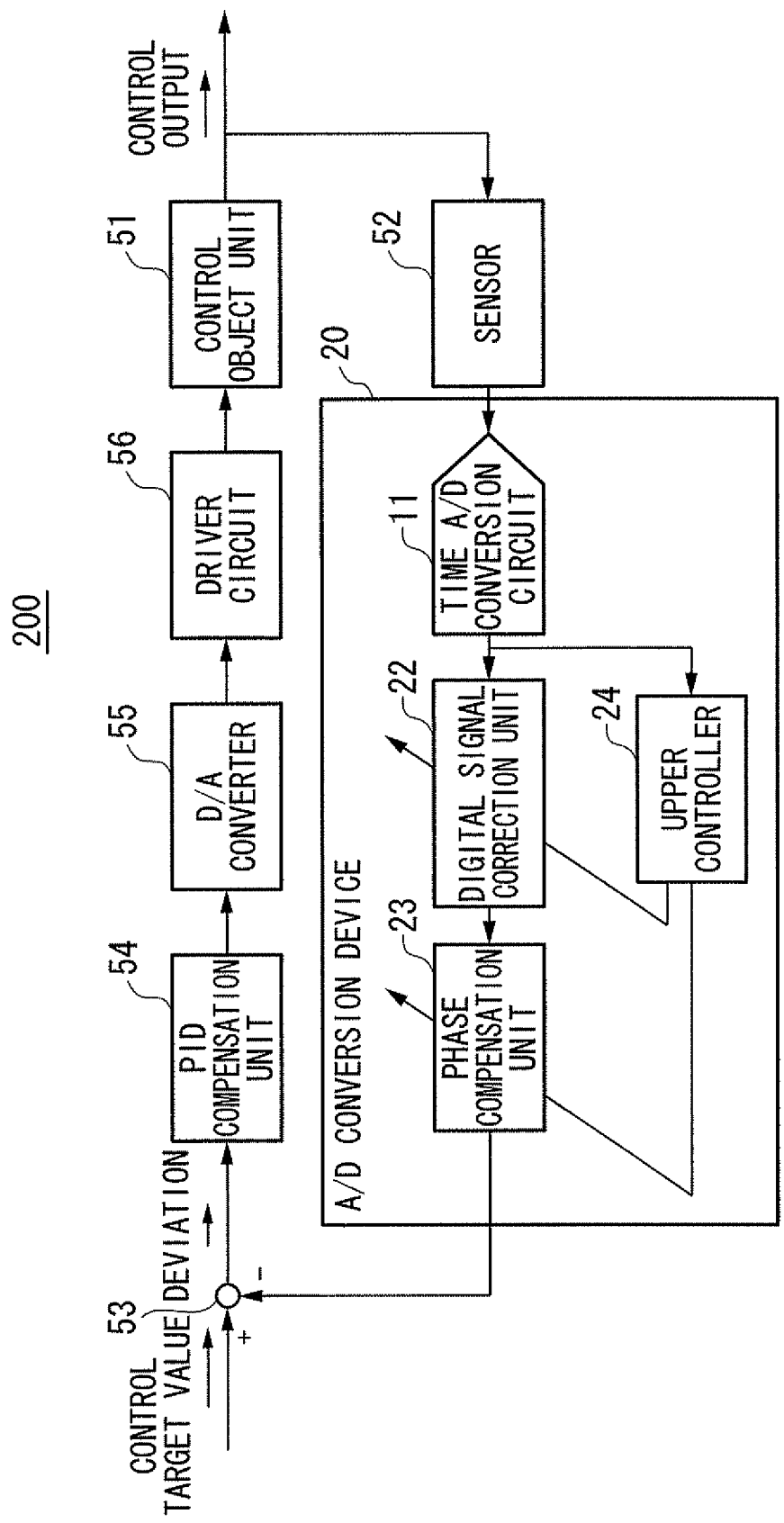
FIG. 9 is a block diagram showing a feedback control device according to a second embodiment.

Referring to FIG. 9, a feedback control device 200 in which characteristics of phase compensation can be modified will be explained. FIG. 9 is a block diagram of a feedback control device 200. The feedback control device 200 includes a control object unit 51, a sensor 52, an A/D conversion device 20, an adder 53, a PID compensation unit 54, a D/A converter 55, and a driver circuit 56. Members having the same functions as those shown above in FIG. 1 are designated with like reference numerals, and reference should be made to FIG. 1 for their explanation; the following explanation will center on the A/D conversion device 20 which has a different configuration.

In the feedback control device 200, the sensor 52 detects a control output that indicates the state of the control object unit 51, and outputs it as an analog signal. The A/D conversion device 20 inputs the analog signal outputted by the sensor 52, converts it to a digital signal, performs a compensation process to the converted digital signal in accordance with that signal, and outputs it. The adder 53 subtracts a feedback signal which is outputted as a digital signal from the A/D conversion device 20 from a control target value of the control output of the controlled object unit 51 inputted to the feedback control device 200, and outputs the difference as a deviation. A manipulation amount in accordance with that deviation is inputted to the control object unit 51, and the control object unit 51 is controlled accordingly.

Thus the flow of the control signal in the feedback control system of the feedback control device 200 complies with the feedback control device 100 shown in FIG. 1, and flows as a negative feedback signal via the A/D conversion device 20 arranged on the feedback path. The feedback control device 200 successively controls the control object unit 51 by feedback control. Furthermore, the A/D conversion device 20 arranged on the feedback path has a function of switching the phase compensation characteristic in accordance with the inputted signal. This function is used to stabilize the feedback control device 200.

Subsequently, the constituent parts of the A/D conversion device 20 will be explained. A digital signal outputted from the time A/D conversion circuit 11 is inputted to a digital signal correction unit 22. The digital signal correction unit 22 subjects an error signal contained in the inputted digital signal to the correction process described above with reference to FIG. 4, and outputs a corrected signal. The digital signal correction unit 22 can also modify the characteristics based on information represented by a setting signal from an upper controller 24 which it is connected to the digital signal correction unit 22. When the setting signal from the upper controller 24 is inputted to the digital signal correction unit 22, the digital signal correction unit 22 can store the information indicated in the inputted setting signal in a variables storage unit provided in an internal semiconductor memory or the like which are provided in the digital signal correction unit 22, perform a correction process based on the stored information, and output a corrected signal. The setting signal inputted from the upper controller 24 contains information relating to the number of input signals (number of samples m) used in a moving average process.

In the A/D conversion device 20, the phase compensation unit 23 performs a predetermined arithmetic operation to compensate the phase delay amount for the input signal that is appended in the conversion process in the time A/D conversion circuit 11 and in the signal process in the digital signal correction unit 22, i.e. the phase delay amount generated when the inputted analog signal is converted to a digital signal and output as a digital signal, and outputs a digital signal which the phase delay amount has been subtracted from.

Figure 10:
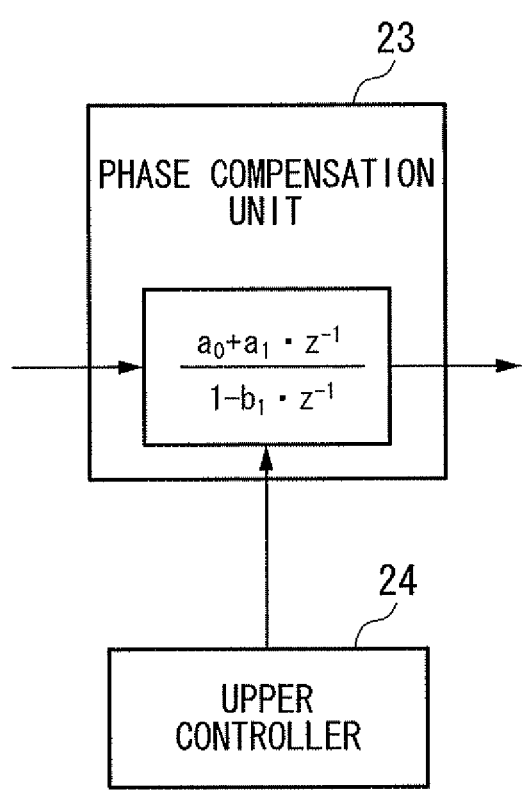
FIG. 10 is a block diagram showing a phase compensation unit according to a second embodiment.

Referring to FIG. 10, there will be explained an operation of the phase compensation unit 23 whose setting is modified by the upper controller 24 connected to it. The characteristics of the phase compensation unit 23 are modified on the basis of information relating to a setting signal input from the upper controller 24 connected to it. When the setting signal is inputted to the phase compensation unit 23 from the upper controller 24, the phase compensation unit 23 can store the information indicated in the inputted setting signal in a variables storage unit provided in an internal semiconductor memory or the like which are provided in the digital signal correction unit 22, perform a correction process based on the stored information, and output a corrected signal. The characteristics of the phase compensation unit 23 can be expressed with the same transfer function as that of phase compensation unit 13 shown earlier. The transfer function is defined according to equation (9) above, and the characteristics of the transfer function are decided according to the variables $a_0$, $a_1$, and $b_1$ set by the upper controller 24. The values of the variables $a_0$, $a_1$, and $b_1$ are inputted to the phase compensation unit 23 from the upper controller 24, and the process of equation (9) is performed based on those inputted variables $a_0$, $a_1$, and $b_1$.

The upper controller 24 includes an arithmetic operation unit, a random access memory (RAM), a read only memory (ROM), an electrically erasable and programmable read only memory (EEPROM), an input/output (I/O), etc. In the upper controller 24, the arithmetic operation unit that executes the arithmetic operation uses the RAM as a temporary work area, a setting storage region, or a program region, while executing a basic program as necessary which is written in the ROM, and controls external apparatuses, internal apparatuses, and the like which are connected via the I/O. The upper controller 24 also uses the EEPROM, which is provided as a storage region inside the A/D conversion device 20, as a storage region for information such as processing programs, various tables of information, and information such as processing results. The arithmetic operation mentioned above can be realized by a central processing unit (CPU) or a digital signal processor (DSP).

A digital signal outputted by the time A/D conversion circuit 11 is inputted to the upper controller 24 via the I/O, and captured as data. In accordance with a result processed in the arithmetic operation unit, the upper controller 24 creates setting information relating to control variables for deciding the characteristics of the digital signal correction unit 22 and the phase compensation unit 23. The upper controller 24 inputs a control signal including the created control variables at the digital signal correction unit 22 and the phase compensation unit 23. Thus, the characteristics of the digital signal correction unit 22 and the phase compensation unit 23 are switched.

Subsequently, the effect achieved when the upper controller 24 has switched the characteristics of the digital signal correction unit 22 and the phase compensation unit 23 will be explained. By way of example, a case where a signal outputted from the time A/D conversion circuit 11 has an unscheduled large change amount will be explained. When a digital signal outputted from the time A/D conversion circuit 11 contains an abruptly changing component, in a moving average process where the number of samples is not modified, the output will be considerably affected. In this state, the output value of the A/D conversion device 20 will appear varied. Accordingly, when the upper controller 24 detects that the existence of an abruptly changing component has resulted in an unscheduled large change amount, the number of samples used in the moving average process of the digital signal correction unit 22 is increased. Consequently, the signal component with an unscheduled large change amount in the inputted digital signal can be subjected to an averaging process using a greater number of samples, enabling unscheduled precipitous signal change to be suppressed. Also, if the signal with unscheduled precipitous change is a signal generated randomly in every inputted digital signal sample, such as noise, the suppressing effect of the moving average process using a greater number of samples will be even more significant. This process can be implemented whenever the upper controller 24 detects a digital signal outputted from the time A/D conversion circuit 11 as needed.

Due to the modification of the number of samples in the moving average process executed to the digital signal inputted from the time A/D conversion circuit 11, in the digital signal correction unit 22, the phase delay amount in the signal outputted as the moving average process result fluctuates. Accordingly, in accordance with the modification of the number of samples in the moving average process in the digital signal correction unit 22, the phase compensation unit 23 sets variables for performing a correction process to reduce the effects of fluctuation in the phase delay amount, and corrects the fluctuating phase delay amount by modifying the characteristics of the phase compensation process.

Subsequently, a creating process of control variables performed by the upper controller 24 will be explained. The upper controller 24 refers to an inputted signal table, and detects the change amount of an inputted peak value. The change amount $\Delta DT(k)$ at sampling time k is defined by an absolute value of the difference between the value of a digital signal $DT(k)$ inputted at the most recent sampling time k, and the value of a digital signal $DT(k-1)$ inputted at the immediately preceding sampling time $(k-1)$. The change amount $\Delta DT(k)$ is shown by equation (12) below.

$$\Delta DT(k)=|DT(k)-DT(k-1)| \tag{12}$$

Based on the size of the change amount $\Delta DT(k)$ shown by equation (12), the upper controller 24, in compliance with the classification of the size of the change amount $\Delta DT(k)$ as defined in accordance with a predetermined range, decides a number of samples m to be used in the moving average process performed in the digital signal correction unit 22.

In accordance with the value of the number of samples m, variables for deciding the characteristics of the digital signal correction unit 22 and the phase compensation unit 23 are set. The variables for deciding the characteristics can be determined using the equations (1) to (9).

Referring to FIG. 11, a variables table that stores setting information in the A/D conversion device 20 will be explained. FIG. 11A is a schematic diagram of a data configuration and data example of an inputted signal table which stores digital signals inputted to the upper controller 24. As shown in FIG. 11A, the inputted signal table includes data in a two-dimensional display format formed from rows and columns, and has a column of each term for the sampling number (k) and the digital data $DT(k)$. An index uniquely indicating digital data inputted instead of the time information inputted to the upper controller is recorded as the sampling number k. A value indicating a peak value of the data inputted in accordance with the sampling number k is recorded in the digital data $DT(k)$. The inputted signal table has two rows, which record the values of the digital data $DT(k)$ and the digital data $DT(k-1)$ indicated by two consecutive sampling numbers k and $(k-1)$. The data of the previous sampling number $(k-1)$ is overwritten when the next data is recorded, and digital data $DT(k+1)$ indicating the most recent sampling number $(k+1)$ is then recorded.

FIG. 11B is a schematic diagram showing a data configuration and data examples in a number-of-samples selection table referred to when selecting a number of samples for use in a moving average process of the digital signal correction unit 22. As shown in FIG. 11B, the number-of-samples selection table includes data in a two-dimensional display format formed from rows and columns, and has a column of each term for the number, change amount threshold $\Delta DT\_max$, and the number of samples m for performing a moving average process. Each row of the number-of-samples selection table shows a change amount threshold ΔDT_max for categorizing the change amount Δx, and a number of samples for moving average process selected in the moving average process. The change amount threshold ΔDT_max indicates a threshold that the value of the digital data DT(k) detected in the upper controller 24 is compared with when categorizing the digital data DT(k) according to its size. The values of the digital data DT(k) are sequentially compared with the change amount threshold ΔDT_max, and, from among the rows where the value of the digital data DT(k) is equal to or less than the respective change amount threshold ΔDT_max, a number of samples m indicated in a row that indicates the largest change amount threshold ΔDT_max is selected. The digital signal correction unit 22 performs a moving average process using the selected number of samples m. Here, in the column showing number of samples m, numerical values determined beforehand in accordance with the size of the respective changes are stored.

FIG. 11C is a schematic diagram showing a data configuration and data examples in a variables table that stores setting information set in the digital signal correction unit 22 and the phase compensation unit 23 when performing a moving average process and a phase compensation process. As shown in FIG. 11C, the variables table includes data in a two-dimensional display format formed from rows and columns, and has a column of each term for sampling cycle $T_s$, gain intersection frequency $f_m$, number of samples m for performing a moving average process, phase lead amount $ø_m$ for performing a phase compensation process, continuous time system transfer function variables α and $T_m$, and discrete time system transfer function variables $a_0$, $a_1$, and $b_1$. The row of the variables table indicates each the variables selected in accordance with the number of samples m selected in the moving average process. From the sampling cycle $T_s$, the number of samples m for performing a moving average process, and the gain intersection frequency $f_m$, the phase lead amount $ø_m$ for performing the phase compensation process can be determined using equation (13) below.

$$\phi_m = m \times T_s \times f_m \times 360° = \frac{m \times T_s}{T_{fm}} \times 360° \quad (13)$$

Using the values of the number of samples m for performing a moving average process, the gain intersection frequency $f_m$, the phase lead amount $ø_m$ for performing a phase compensation process, and $T_{fm}$ indicated in equation (14), and the functional equations described earlier, it is possible to determine values for the continuous time system transfer function variables α and $T_m$, and for the discrete time system transfer function variables $a_0$, $a_1$, and $b_1$.

$$T_{fm} = \frac{1}{f_m} \quad (14)$$

In equation (14), $T_{fm}$ represents the cycle of the gain intersection frequency $f_m$. The selected number of samples m is applied in the moving average process at the digital signal correction unit 22, and the variables $a_0$, $a_1$, and $b_1$ are applied in the phase compensation process at the phase compensation unit 23. By using such a variable table, it becomes possible to set the characteristics in both the moving average process at the digital signal correction unit 22 and the phase compensation process at the phase compensation unit 23.

The phase lead amount $ø_m$ for performing a phase compensation process and the gain intersection frequency $f_m$ are constants determined beforehand according to the characteristics of the system for application. When the information stored in the variables table is used as jointly used constants, the standard value of each piece of information can be set and stored beforehand.

Figure 12:
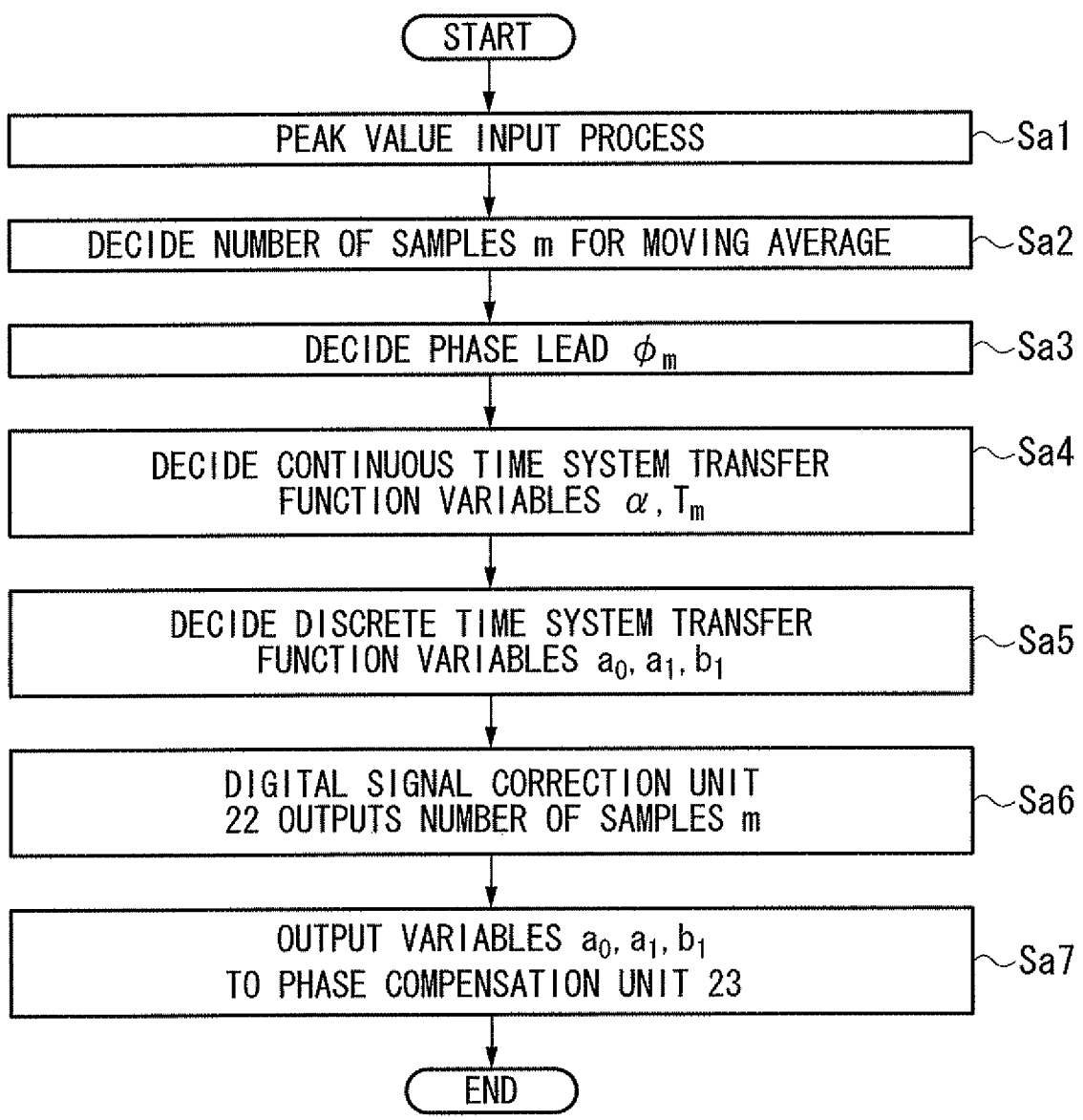
FIG. 12 is a flowchart of a process of an upper controller according to a second embodiment.

A characteristic modification process of the A/D conversion device 20 using the upper controller 24 will be explained using the flowchart of FIG. 12. Firstly, a digital signal outputted from the time A/D conversion circuit 11 is inputted to the upper controller 24. The upper controller 24 applies the value of the sample time k and the value (peak value) indicated by the inputted digital signal in a peak value input process to store them in an inputted signal table (step Sa1). The upper controller 24 then refers to the inputted signal table, and determines the change amount ΔDT(k) of the peak value from value DT(k) of the inputted peak value. The change amount ΔDT(k) at the sample time k is defined according to an absolute value |DT(k)−DT(k−1)| of the difference between the value of the digital signal DT(k) converted at the most recent sampling time k, and the value of a digital signal DT(k−1) converted at the immediately preceding sampling time (k−1). The upper controller 24 refers to the number-of-samples selection table, and, in compliance with a category where the size of the change amount ΔDT(k) is defined within a predetermined range, decides the number of samples m for a moving average process to be performed in the digital signal correction unit 22, and stores that value in the variables table (step Sa2).

The upper controller 24 refers to the number of samples m stored in the variables tables, decides a phase lead amount $ø_m$ in accordance with the number of samples m decided above, and stores that value in the variables table. The phase lead amount $ø_m$ in accordance with the number of samples m is determined by the arithmetic operation shown above in equation (13) (step Sa3). The upper controller 24 refers to the number of samples m and the phase lead amount $ø_m$ stored in the variables table, decides transfer function variables α and $T_m$ for a continuous time system of a phase lead compensation process that is processed in the phase compensation unit 23, and stores them in the variables table. The variables α and $T_m$ that are in accordance with the number of samples m and the phase lead amount $ø_m$ are determined by the arithmetic operation shown above in equations (2) and (3) (step Sa4). The upper controller 24 refers to the values of the variables α, $T_m$, and $T_s$ of the transfer function stored in the variables table, decides the variables $a_0$, $a_1$, and $b_1$ for the transfer function in the discrete time system of a phase lead compensation process processed in the phase compensation unit 23, and stores those values in the variables table. The variables $a_0$, $a_1$, and $b_1$ that are in accordance with the variables α, $T_m$ and $T_s$ are determined by the arithmetic operations shown above in equations (6) to (8) (step Sa5).

The upper controller 24 refers to the number of samples m stored in the variables table, and outputs the decided number of samples m for moving average process as a characteristic setting signal of the digital signal correction unit 22 to the digital signal correction unit 22. The digital signal correction unit 22 stores the inputted number of samples m in an internal storage unit, and, in compliance with the number of samples m stored in an internal variables storage unit, performs a moving average process to m samples; the digital signal correction unit 22 inputs the result of this moving average process to the phase compensation unit 23 (step Sa6). The upper controller 24 outputs the variables $a_0$, $a_1$, and $b_1$ stored in the variables table as a characteristic setting signal of the phase compensation unit 23 to the phase compensation unit 23. The phase compensation unit 23 stores the inputted variables $a_0$, $a_1$, and $b_1$ in its internal variables storage unit, and, in compliance with the variables $a_0$, $a_1$, and $b_1$ stored in the internal variables storage unit, performs a phase compensation process based on the result of the moving average process inputted from the digital signal correction unit 22. The phase compensation unit 23 then outputs the result of the phase compensation process as the output of the A/D conversion device 20, and ends the phase compensation process (step Sa7).

As described above, in the second embodiment, the upper controller 24 can link and switch the characteristics of the digital signal correction unit 22 and the phase compensation unit 23 in accordance with the output of the time A/D conversion circuit 11. This switching of the characteristics of the phase compensation unit 23 makes it possible, by modifying the variables for deciding the characteristics of the phase compensation process, to modify the characteristics of the digital signal correction units 22 and 32, and the characteristics of the phase compensation units 23 and 33 as necessary in accordance with the state of the inputted signal. Therefore, it is possible to detect that an input signal having an abnormal value has been inputted to the A/D conversion devices 20 and 30, and to perform a process as necessary to reduce the effect of that abnormal signal. Even if the characteristics of the system fluctuate, control can be executed in accordance with the fluctuation. In the first embodiment described above, the characteristics of the phase compensation unit 13 in the A/D conversion device 10 are decided depending on predetermined variables, and the compensation characteristics of the A/D conversion device 10 remain fixed while a device that applies the A/D conversion device 10 is operating. In the second embodiment, the upper controller 24 can modify the settings programmably and arbitrarily, making it possible to execute control as necessary in accordance with the state of the inputted signal.

Third Embodiment

In the third embodiment, the variables for deciding the characteristics of the phase compensation unit in an A/D conversion device 30 can be modified.

Figure 13:
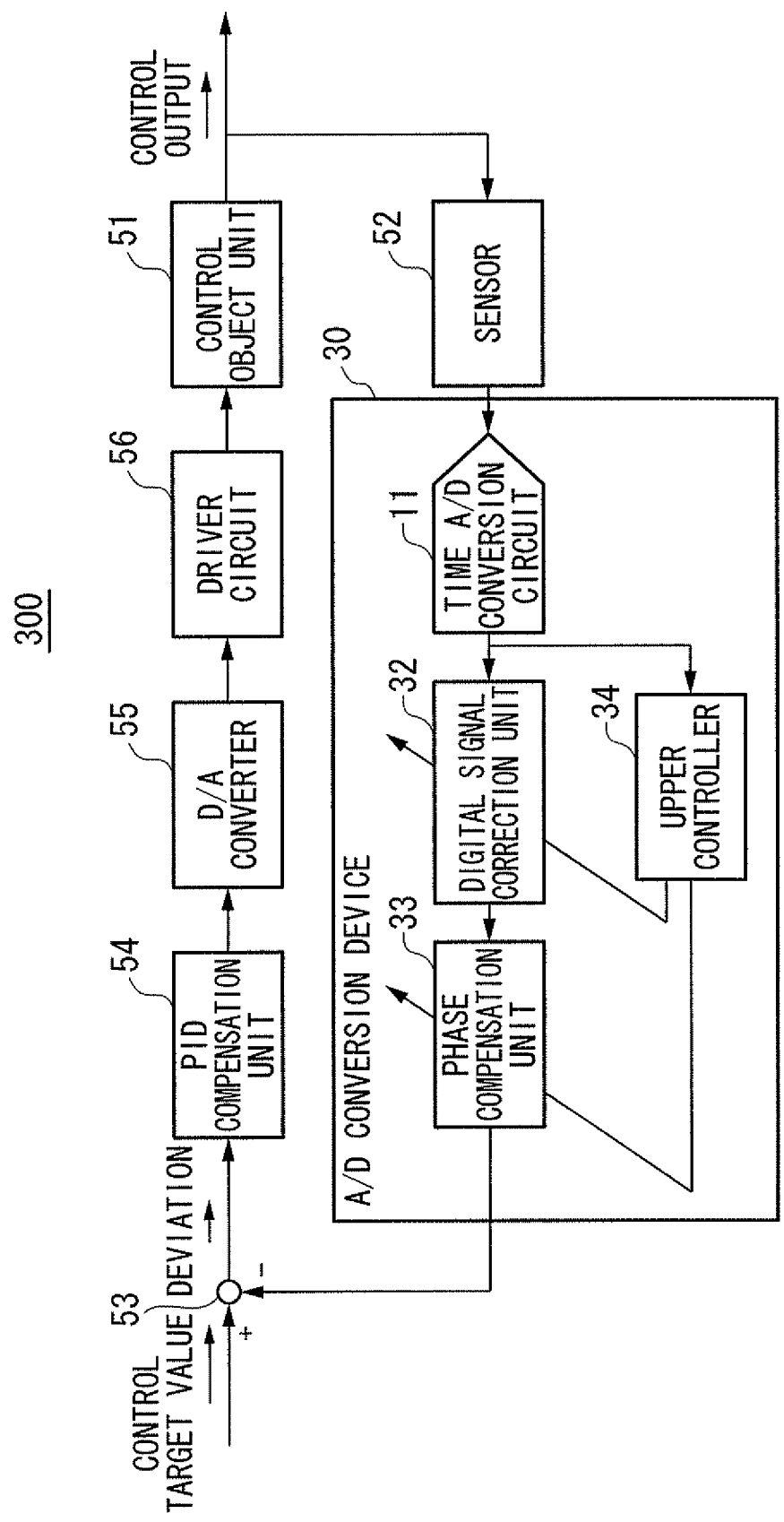
FIG. 13 is a block diagram showing a feedback control device according to a third embodiment.

FIG. 13 is a block diagram of a feedback control device 300. Referring to FIG. 13, a feedback control device 300 wherein phase compensation characteristics can be modified will be explained. The feedback control device 300 includes a control object unit 51, a sensor 52, an A/D conversion device 30, an adder 53, a PID compensation unit 54, a D/A converter 55, and a driver circuit 56. Members having the same functions as those shown above in FIG. 1 are designated with like reference numerals, and reference should be made to FIG. 1 for their explanation; the following explanation will center on the A/D conversion device 30 which has a different configuration.

In the feedback control device 300, the sensor 52 detects a control output that indicates the state of the control object unit 51, and outputs it as an analog signal. The A/D conversion device 30 which is inputted the analog signal outputted by the sensor 52, converts it to a digital signal, performs a compensation process to the converted digital signal in accordance with that signal, and outputs it. The adder 53 subtracts a feedback signal, which a digital signal outputted via the A/D conversion device 30, from a desired target value of the control output of the controlled object unit 51 inputted to the feedback control device 300, and outputs the difference as a deviation. a manipulation amount in accordance with that deviation is inputted to the control object unit 51, and the control object unit 51 is controlled accordingly.

Thus the flow of the control signal in the feedback control system of the feedback control device 300 complies with the feedback control device 100 shown in FIG. 1, and flows as a negative feedback signal via the A/D conversion device 30 arranged on the feedback path. The feedback control device 300 successively controls the control object unit 51 by feedback control. Furthermore, the A/D conversion device 30 arranged on the feedback path has a function of switching the phase compensation characteristics in accordance with the inputted signal. This function is used to stabilize the feedback control device 300.

Subsequently, the constituent parts of the A/D conversion device 30 will be explained. In the A/D conversion device 30, a digital signal outputted from the time A/D conversion circuit 11 is inputted to a digital signal correction unit 32. The digital signal correction unit 32 subjects an error signal contained in the inputted digital signal to the correction process described above with reference to FIG. 4, and outputs a corrected signal. The digital signal correction unit 32 can also modify the characteristics based on information represented by a setting signal from an upper controller 34 which it is connected to. When the setting signal from the upper controller 34 is inputted to the digital signal correction unit 32, the digital signal correction unit 32 can store the information indicated in the inputted setting signal in a variables storage unit provided in an internal semiconductor memory or the like. The digital signal correction unit 32 can then perform a correction process based on the stored information, and output a corrected signal. The setting signal inputted from the upper controller 34 contains information relating to the number of input signals (number of samples m) used in a moving average process.

Figure 14:
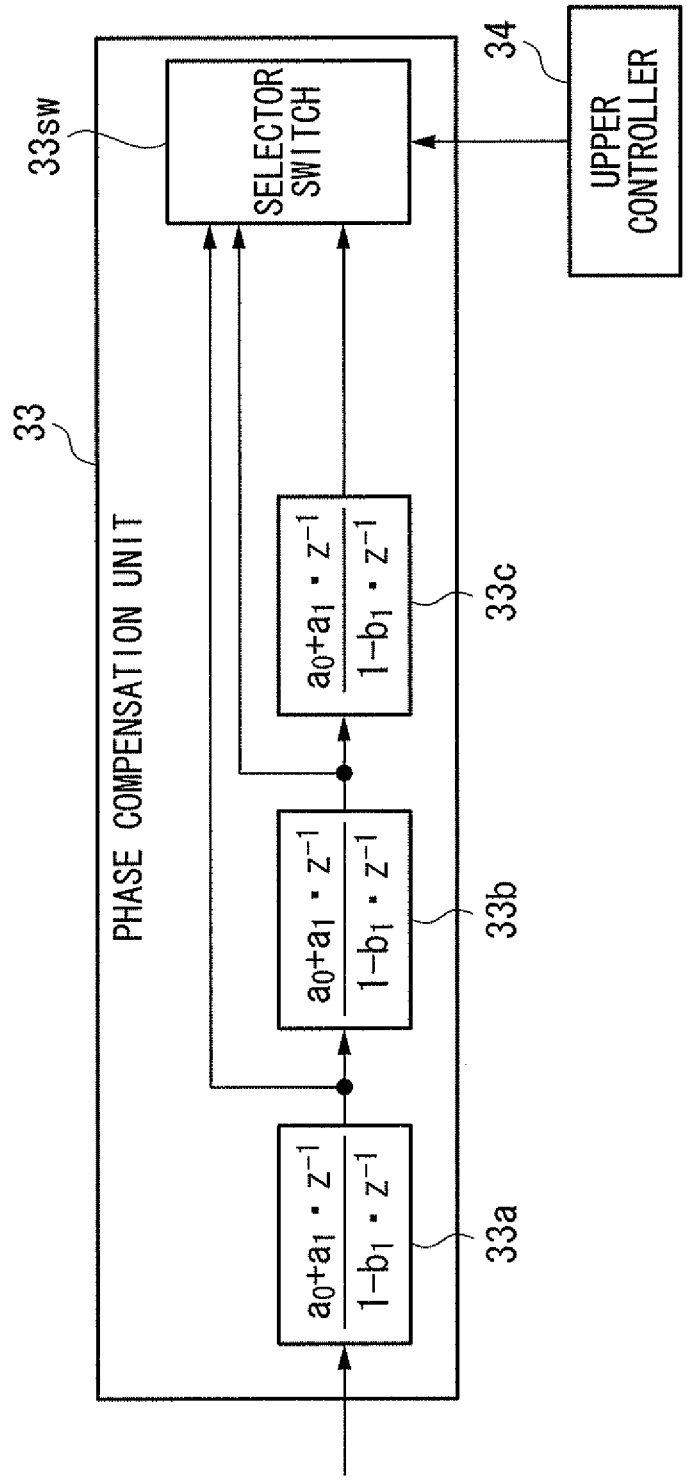
FIG. 14 is a block diagram showing a phase compensation unit according to a third embodiment.

Referring to FIG. 14, the configuration of a phase compensation unit 33 according to the third embodiment will be explained. In the A/D conversion device 30, the phase compensation unit 33 performs a predetermined arithmetic operation to compensate the phase delay amount for the input signal that is appended in the conversion process in the time A/D conversion circuit 11 and in the signal process in the digital signal correction unit 32, i.e. the phase delay amount generated when the inputted analog signal is converted to a digital signal and output as a digital signal, and outputs a digital signal which the phase delay amount has been reduced. The block diagram of FIG. 14 shows the connection between the internal configuration of the phase compensation unit 33 and the upper controller 34. The phase compensation unit 33 includes a phase compensation processors 33a, 33b, and 33c, and a selector switch 33SW.

In the phase compensation unit 33, the input terminal of the phase compensation processor 33a is connected to the input terminal of the phase compensation unit 33, and its output terminal is connected to the input terminal of the phase compensation processor 33b and a first input terminal of the selector switch 33SW. The input terminal of the phase compensation processor 33b is connected to the output terminal of the phase compensation processor 33a, and its output terminal is connected to the input terminal of the phase compensation processor 33c and a second input terminal of the selector switch 33SW. The input terminal of the phase compensation processor 33c is connected to the output terminal of the phase compensation processor 33b, and its output terminal is connected to a third input terminal of the selector switch 33SW. The first input terminal of the selector switch 33SW is connected to the output terminal of the phase compensation processor 33a, its second input terminal is connected to the output terminal of the phase compensation processor 33b, its third input terminal is connected to the output terminal of the phase compensation processor 33c, its switch control input terminal is connected to the upper controller 34, and its output terminal is connected to the output terminal of the A/D conversion device 30. Though not shown in FIG. 14, the control input terminals of the phase compensation processors 33a, 33b, and 33c are connected to the upper controller 34, and values for the variables $a_0$, $a_1$, and $b_1$ are set beforehand.

The phase compensation processors 33a, 33b, and 33c are constituent components having phase compensation characteristics that, independently of each other, work in the same manner as the phase compensation unit 23 shown in FIG. 10. The control variables $a_0$, $a_1$, and $b_1$ are determined using the same method as that used by the phase compensation unit 23 described in the second embodiment, and are set after being inputted the variables $a_0$, $a_1$, and $b_1$ from the upper controller 34 at the time of initialization. The same variables are set such that the phase compensation processors 33a, 33b, and 33c have the same respective characteristics. In compliance with the control signal from the upper controller 34, the selector switch 33SW selects and outputs a signal inputted to it from each of the phase compensation units.

The upper controller 34 can be realized with the same configuration as the upper controller 24 described earlier, and reference should be made to the upper controller 24 for further explanation.

The digital signal outputted by the time A/D conversion circuit 11 is inputted to the upper controller 34 via the I/O, and is loaded as data. In accordance with a result processed in the arithmetic operation unit, the upper controller 34 creates setting information as control variables for deciding the characteristics of the digital signal correction unit 32 and the phase compensation unit 33. The upper controller 34 outputs a control signal having the created control variables to the digital signal correction unit 32 and the phase compensation unit 33, and the outputted signal is inputted to the digital signal correction unit 32 and the phase compensation unit 33 connected to the upper controller 34. Accordingly, the characteristics of the digital signal correction unit 32 and the phase compensation unit 33 are switched.

A subsequent process whereby the upper controller 34 creates the number of samples m as a control variable is the same as the process of the upper controller 24 described above; reference should therefore be made to the process performed by the upper controller 24.

The variables for deciding the characteristics of the phase compensation unit 33 are determined beforehand, in accordance with the value of the number of samples m set in the digital signal correction unit 32. The determined variables are then stored in a variables table 2. A selection signal of the selector switch 33SW which is variables for deciding the phase compensation characteristic of the phase compensation unit 33 is set in the table 2, for each value of the number of samples m affecting the phase delay amount generated in the digital signal correction unit 32 and this selection signal being stored in the table 2 beforehand.

Figures 15, 16:
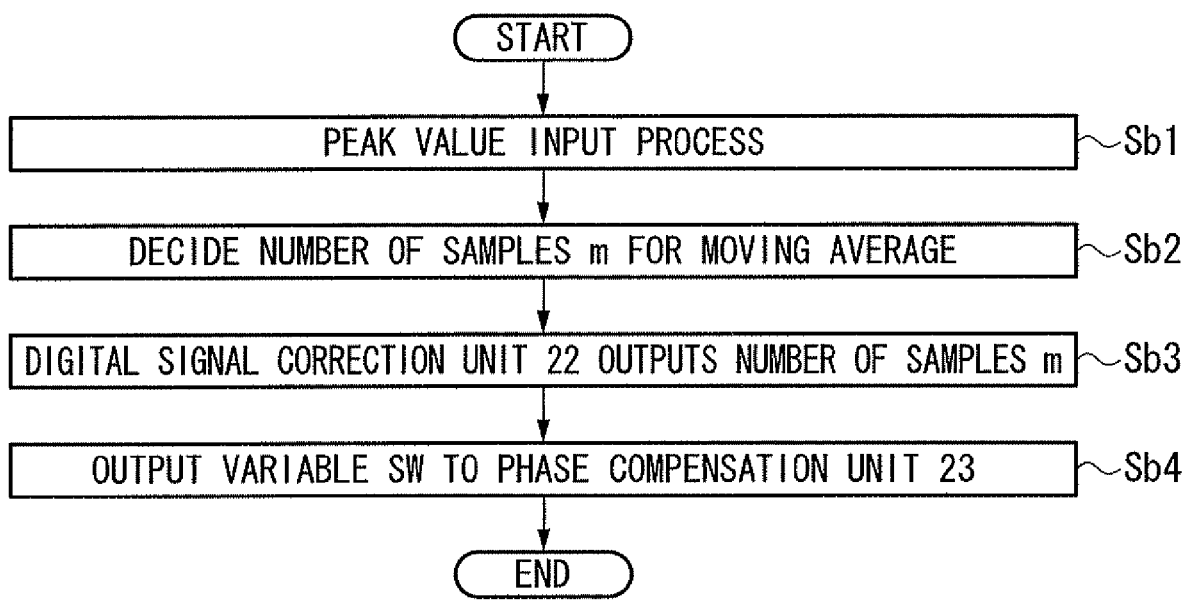
FIG. 15 is a diagram of various tables referred to in a process of an upper controller according to a third embodiment.
FIG. 16 is a flowchart of a process of an upper controller according to a third embodiment.

Referring to FIG. 15, tables for storing various types of information in the A/D conversion device 30 will be explained. Incidentally, FIGS. 11A and 11B should be referred to for explanation of the inputted signal table and the number-of-samples selection table; here, only a variable m storage unit and the variables table 2 will be explained.

The storage unit for variable m is a storage unit that stores a value of the number of samples m in the moving average process at the digital signal correction unit 32. FIG. 15 is a schematic diagram of the data configuration and data examples of the variables table 2 that stores setting information set at the phase compensation unit 33 when performing a phase compensation process. As shown in FIG. 15, the variables table 2 includes data in a two-dimensional display format formed from rows and columns, and has a column each term for the number, the number of samples m for performing a moving average process, and the selection signal of the selector switch 33SW of the phase compensation unit 33. The rows of the variables table 2 indicate the each variable selected in accordance with the respective number of samples m selected in the moving average process. Also an input selection variable SW that correlates the number of samples m selected in the moving average process in the phase compensation unit 33 with an input selection signal of the selector switch 33SW for selecting a number of processing stages of the phase compensation processor in the phase compensation process in the phase compensation unit 33 is stored.

A characteristic modification process of the A/D conversion device 20 performed by the upper controller 34 will be explained using the flowchart in FIG. 16. In the characteristic modification process explained below, the characteristics of the phase compensation processors 33a, 33b, and 33c in the phase compensation unit 33 can be set. In addition, the required phase compensation amount can be modified by switching the number of processing stages, making it possible to simply the characteristic modification process that is performed repeatedly. In the way of performing the characteristic modification process, the variables $a_0$, $a_1$, and $b_1$ of the phase compensation processors 33a, 33b, and 33c in the phase compensation unit 33 must be set beforehand, and become the constants that are not modified between the processes described below.

Firstly, a digital signal outputted from the time A/D conversion circuit 11 is inputted to the upper controller 34. The upper controller 34 performs a peak value input process which the upper controller 34 records the value of the sample time k and the value (peak value) indicated by the inputted digital signal to the inputted signal table (step Sb1). The upper controller 34 then refers to the inputted signal table, and determines the change amount ΔDT(k) of the peak value from value DT(k) of the inputted peak value. The change amount ΔDT(k) at the sample time k is defined according to an absolute value |DT(k)−DT(k−1)| of the difference between the value of the digital signal DT(k) converted at the most recent sampling time k, and the value of a digital signal DT(k−1) converted at the immediately preceding sampling time (k−1). The upper controller 34 refers to the number-of-samples selection table, and, in compliance with a category where the size of the change amount data ΔDT(k) is defined within a predetermined range, decides the number of samples m for a moving average process to be performed in the digital signal correction unit 32, and stores that value in the variable m storage unit (step Sb2).

The upper controller 34 refers to the number of samples m stored in the variable m storage unit, and outputs the decided number of samples m for the moving average process as a characteristics setting signal of the digital signal correction unit 32 to the digital signal correction unit 32.

The digital signal correction unit 32 stores the inputted number of samples m in an internal storage unit, and, in compliance with the number of samples m stored in an internal variables storage unit, performs a moving average process to m samples; the digital signal correction unit 32 inputs the result of this moving average process to the phase compensation unit 33 (step Sb3). The upper controller 34 refers to the number of samples m stored in the variable m storage unit. The upper controller 34 refers to the variables table 2, refers to the input selection variable SW that corresponds with the value of the number of samples m, and inputs that input selection variable SW to the phase compensation unit 33 as a characteristic setting signal of the phase compensation unit 33. The phase compensation unit 33 stores the inputted input selection variable SW in an internal variable storage unit, and, in compliance with the input selection variable SW stored in the internal variable storage unit, selects an inputted signal to the selector switch 33SW; it then outputs the selected inputted signal as an output signal of the selector switch 33SW. The phase compensation processors 33a, 33b, and 33c constituting the phase compensation unit 33 perform a phase compensation process using the set constants to their respective inputted signals. The selector switch 33SW outputs the output signal from the selected phase compensation processor connected to its input as the output signal of the phase compensation unit 33, outputs the result of the phase compensation process as the output of the A/D conversion device 30, and then ends the phase compensation process (step Sb4).

As described above, in the third embodiment, when modifying the characteristics of the phase compensation unit in the A/D conversion device, the upper controller 34 switches the number of stages of a phase compensation process which does not modify the characteristics and switches the characteristics of the phase compensation unit, whereby the characteristics of the digital signal correction unit 32 and the phase compensation unit 33 can be linked and switched in accordance with the output of the time A/D conversion circuit 11. In switching the characteristics of the phase compensation unit 33, continuity of the signal when switching can be compensated by switching the number of stages of the phase compensation process which processes in multiple stages. Furthermore, the process when switching can be simplified, and the processing load to the phase compensation processors can be reduced.

The present invention is not limited to the foregoing embodiments, and can be modified without departing from the main points of the invention. The feedback control devices 100, 200, and 300 of the invention can be applied in an arbitrary system; the transmission characteristics of the arbitrary system are unique to that device, and the phase compensation amount in the phase compensation units 13, 23, and 33 can be modified in accordance with the transmission characteristics of the system in which the invention is applied. The conversion process time in the time A/D conversion circuit 11, and the number of samples for performing the moving average process in the digital signal correction units 12, 22, and 32 can be modified in accordance with the system. The phase compensation characteristics in the phase compensation units 13, 23, and 33 can be modified in accordance with the system, and the invention is not limited to the configurations and variables shown in the embodiments.

The CLK signal CKs in the time A/D conversion circuit 11 can use a clock generated by multiplying the clock indicating the cycle for performing a signal process in the digital signal correction units 12, 22, and 32 and the phase compensation units 13, 23, and 33. By increasing the speed of the frequency of the CLK signal CKs, the conversion delay time of the time A/D conversion circuit 11 can be reduced. The time A/D conversion circuit 11 is not limited to a time A/D conversion-type A/D conversion circuit, and can be substituted with a time A/D conversion circuit using another method such as sequential comparison. In the second embodiment, the variables for deciding the characteristics of the digital signal correction unit 22 and the phase compensation unit 23 can be determined for each value of the number of samples m determined beforehand, and a variables table of the determined variables can be prepared beforehand. At this time, the variables table is one that defines variables for deciding the characteristics of the digital signal correction unit 22 and the phase compensation unit 23 for each value of the number of samples m. The constants required for each variable are stored beforehand.

While the explanation of the third embodiment describes a three-stage phase compensation process in the phase compensation unit 33 as shown in the drawings, it is possible to connect more stages in series, and make a selection from the results of multiple process stages. Characteristics that are difficult to realize in a single-stage phase compensation process can thus be obtained by dispersing to the phase compensation units in multiple stages.

The servo control device of the invention corresponds to the feedback control devices 100, 200, and 300. The A/D conversion device of the invention corresponds to the A/D conversion devices 10, 20, and 30. The A/D conversion circuit of the invention corresponds to the time A/D conversion circuit 11. The pulse transit circuit of the invention corresponds to the pulse transit circuit 1. The transit position detection structure of the invention corresponds to the counter 2 and the encoder 3. The digital data creation structure of the invention corresponds to the latch circuits 4, 5, and 6, and the arithmetic device 7. The digital signal compensation unit of the invention corresponds to the digital signal correction units 12, 22, and 32. The phase compensation unit of the invention corresponds to the phase compensation units 13, 23, and 33. The upper controller of the invention corresponds to the upper controllers 24 and 34.

INDUSTRIAL APPLICABILITY

According to the present invention, an A/D conversion circuit converts an inputted analog signal to a digital signal, a digital signal correction unit of a later stage corrects variation in the digital signal, and a phase compensation unit can perform phase compensation as necessary to the delay time fluctuation.

| [Reference Numerals] | |
| --- | --- |
| 100 | Feedback control device |
| 10 | A/D conversion device |
| 11 | Time A/D conversion circuit |
| 12 | Digital signal correction unit |
| 13 | Phase compensation unit |
| 51 | Control object unit |
| 52 | Sensor |
| 53 | Adder |
| 54 | PID compensation unit |
| 55 | D/A converter |
| 56 | Driver circuit |

What is claimed is:

1. An A/D conversion device comprising: an A/D conversion circuit that converts an inputted analog signal to digital data and outputs it; a digital signal correction unit that performs a correction process to the digital data and outputs a digital signal; and a phase compensation unit that performs phase compensation in accordance with a phase delay amount of the digital signal with respect to the analog signal generated in the A/D conversion circuit and the digital signal correction unit, wherein the A/D conversion circuit comprises:

a pulse transit circuit in which plurality of linked inversion circuits including logical elements wherein the delay time between an input signal and output signal changes in accordance with the size of an applied power or an electrical current, and an activation signal for starting a pulse signal is inputted to one of the inversion circuits;

a transmit position detection structure that detects a transit position of the pulse signal in the pulse transit circuit based on the output signals from the inversion circuits and generates data in accordance with the transit position; and a digital data creation structure that, based on the data outputted from the transmit position detection structure, creates digital data corresponding to the size of the power or the electrical current that changes in accordance with the inputted analog signal, the delay characteristic of the digital data being identified from the inputted analog signal.

2. A servo control device in which the A/D conversion device according to claim 1 is inserted into a feedback control loop.

3. The servo control device according to claim 2, wherein the A/D conversion device is inserted on a feedback path within the feedback control loop, and performs phase compensation process of a feedback signal.

4. The A/D conversion device according to claim 1, wherein, in the digital signal correction unit, based on an inputted characteristics setting signal, the characteristic of the correction process is modified, and the delay characteristic generated by the correction process is defined.

5. The A/D conversion device according to claim 1, comprising an upper controller that, based on the state of data outputted from the A/D conversion circuit, correlates and modifies the characteristic of a correction process of the digital signal correction unit and the phase compensation characteristic of the phase compensation unit.

6. The A/D conversion device according to claim 1, wherein, in the phase compensation unit, the characteristic of the phase compensation is modified based on an inputted characteristics setting signal.

* * * * *